(12) United States Patent
Cheung et al.

(10) Patent No.: US 10,502,987 B2
(45) Date of Patent: Dec. 10, 2019

(54) HIGH BANDWIDTH RF OR MICROWAVE INTERCONNECTS FOR OPTICAL MODULATORS

(71) Applicant: Lumentum Operations LLC, Milpitas, CA (US)

(72) Inventors: Siu Kwan Cheung, Storrs, CT (US); Glen Drake, Windsor, CT (US); Karl Kissa, Gilroy, CA (US)

(73) Assignee: Lumentum Operations LLC, Milpitas, CA (US)

( * ) Notice: Subject to any disclaimer, the term of this patent is extended or adjusted under 35 U.S.C. 154(b) by 293 days.

(21) Appl. No.: 15/091,307

(22) Filed: Apr. 5, 2016

(65) Prior Publication Data

US 2016/0299361 A1 Oct. 13, 2016

Related U.S. Application Data

(60) Provisional application No. 62/143,961, filed on Apr. 7, 2015, provisional application No. 62/143,969, filed on Apr. 7, 2015.

(51) Int. Cl.
*G02F 1/01* (2006.01)
*H01P 1/00* (2006.01)
(Continued)

(52) U.S. Cl.
CPC ........... *G02F 1/0121* (2013.01); *G02F 1/011* (2013.01); *H01P 1/00* (2013.01); *H01P 5/085* (2013.01); *H05K 1/0237* (2013.01); *G02F 2203/13* (2013.01); *H05K 1/0222* (2013.01); *H05K 1/116* (2013.01); *H05K 3/32* (2013.01); *H05K 2201/10356* (2013.01); *H05K 2201/10378* (2013.01); *H05K 2201/10962* (2013.01)

(58) Field of Classification Search
CPC .... H05K 1/0237; H05K 3/4697; H05K 1/182; H05K 1/183; H05K 1/184
See application file for complete search history.

(56) References Cited

U.S. PATENT DOCUMENTS 5,043,794 A * 8/1991 Tai .......................... H01L 23/13
257/686
5,129,017 A 7/1992 Kawano et al.
(Continued)

OTHER PUBLICATIONS

H. Miyamoto, et. al., "Design of high efficiency LiNbO3 broadband phase modulator using an electrode buried in buffer layer," Electronics Letters, Jan. 30, 1992, vol. 28, No. 3, pp. 322-324.
(Continued)

*Primary Examiner* — Steven T Sawyer
(74) *Attorney, Agent, or Firm* — Harrity & Harrity, LLP

(57) ABSTRACT

A radio frequency (RF) interconnect for an optical modulator may comprise a circuit board to route a set of RF signals from a corresponding set of RF feeds to a substrate interface on a surface of a substrate of the optical modulator. The circuit board may be positioned along the surface of the substrate of the optical modulator. The circuit board may include a set of traces. A trace, of the set of traces, may be connected to a corresponding RF feed, of the set of RF feeds, at a height different than a height of the surface of the substrate of the optical modulator. The trace may be connected to the substrate interface.

21 Claims, 24 Drawing Sheets

(51) Int. Cl.
*H05K 1/02* (2006.01)
*H01P 5/08* (2006.01)
*H05K 1/11* (2006.01)
*H05K 3/32* (2006.01)

(56) References Cited

U.S. PATENT DOCUMENTS

| | | |
|---|---|---|
| 5,138,480 A | 8/1992 | Dolfi et al. |
| 5,237,204 A * | 8/1993 | Val .................. H01L 23/057 |
| | | 257/691 |
| 5,404,412 A | 4/1995 | Seino et al. |
| 5,455,876 A | 10/1995 | Hopfer et al. |
| 5,473,711 A | 12/1995 | Hakogi et al. |
| 5,497,445 A | 3/1996 | Imoto |
| 5,502,780 A | 3/1996 | Madabhushi |
| 5,563,965 A | 10/1996 | Madabhushi |
| 5,598,490 A | 1/1997 | Hakogi et al. |
| 5,680,497 A | 10/1997 | Seino et al. |
| 5,764,822 A | 6/1998 | Madabhushi |
| 5,790,719 A | 8/1998 | Mitomi et al. |
| 5,883,428 A * | 3/1999 | Kabumoto ............ H01L 23/50 |
| | | 257/532 |
| 5,895,742 A | 8/1999 | Lin |
| 6,069,729 A | 5/2000 | Gill et al. |
| 6,198,855 B1 | 3/2001 | Hallemeier |
| 6,545,791 B1 | 4/2003 | McCaughan et al. |
| 6,580,843 B2 | 6/2003 | Doi et al. |
| 6,584,240 B2 | 6/2003 | Doi et al. |
| 6,603,182 B1 * | 8/2003 | Low .................. B81B 7/0077 |
| | | 257/432 |
| 6,721,085 B2 | 4/2004 | Sugiyama et al. |
| 6,845,183 B2 | 1/2005 | Cheung et al. |
| 7,171,063 B2 | 1/2007 | Feke et al. |
| 7,231,101 B2 | 6/2007 | Nagata |
| 7,863,735 B1 * | 1/2011 | Cho .................. H05K 1/183 |
| | | 257/686 |
| 2010/0307798 A1 * | 12/2010 | Izadian .............. H01L 24/24 |
| | | 174/255 |
| 2012/0242547 A1 * | 9/2012 | Fujii .................. H01Q 1/38 |
| | | 343/700 MS |
| 2013/0257565 A1 * | 10/2013 | Masuda ............... H01P 3/02 |
| | | 333/247 |
| 2014/0189456 A1 * | 7/2014 | Loh ................ G01R 31/2812 |
| | | 714/733 |
| 2014/0293529 A1 * | 10/2014 | Nair ................ H01Q 1/2291 |
| | | 361/679.31 |
| 2014/0328595 A1 * | 11/2014 | Han .............. H04B 10/2575 |
| | | 398/115 |
| 2015/0261062 A1 * | 9/2015 | Sugiyama ............ G02B 6/12 |
| | | 385/14 |

OTHER PUBLICATIONS

H. Miyamoto, et. al., "Evaluation of LiNbO$_3$ intensity modulator using electrodes buried in buffer layer," Electronics Letters, May 21, 1992, vol. 28, No. 11, pp. 976-977.

K. Noguchi, et. al., "Millimeter-wave TiLiNbO$_3$ optical modulators," IEEE Journal of Lightwave Technology, vol. 16, No. 4, Apr. 1998, pp. 615-619.

K. Kawano, "High-speed shielded velocity-matched Ti:LiNbO$_3$ optical modulator," IEEE Journal of Quantum Electronics, Sep. 1993, vol. 29, No. 9, pp. 2466-2475.

* cited by examiner

FIG. 5C

FIG. 5E

HIGH BANDWIDTH RF OR MICROWAVE INTERCONNECTS FOR OPTICAL MODULATORS

RELATED APPLICATIONS

This application claims priority under 35 U.S.C. § 119 to U.S. Provisional Patent Application Nos. 62/143,969 and 62/143,961, both of which were filed on Apr. 7, 2015, the contents of which are incorporated by reference herein in their entirety.

TECHNICAL FIELD

The present disclosure relates generally to radio frequency (RF) interconnects for an optical modulator and, more particularly, to RF interconnects with reduced path lengths on a substrate of an optical modulator in order to reduce RF loss and/or increase bandwidth of the optical modulator.

BACKGROUND

An RF interconnect may feed an RF signal to an optical modulator using an RF waveguide. The RF waveguide may be located in approximately a same plane as an RF electrode on a substrate of the optical modulator. Additionally, a coaxial feedthrough, associated with the RF interconnect and passing through an optical modulator package, is typically positioned at a side of the substrate (e.g., rather than a top or a bottom of the substrate). As such, an RF input bond pad, associated with feeding the RF signal from the coaxial feedthrough to the RF waveguide, is also typically positioned at the side of the substrate and, therefore, is typically positioned parallel to the RF electrode on a plane of the substrate. Thus, routing of the RF signal is needed on the substrate in order to route the RF signal from the RF input bond pad to the RF electrode. Such routing on the modulator substrate may result in RF loss and/or may result in a reduced 3 decibel (dB) bandwidth of the optical modulator. The RF loss may be increased due to a change in direction of the RF signal during routing on the substrate (e.g., a 90-degree change in direction, or another direction change associated with the RF routing on the substrate). The RF loss may be compounded when the RF interconnect includes multiple RF signals being planarly routed from an array of RF input bond pads to a corresponding array of RF electrodes on a planar surface of the substrate.

SUMMARY

According to some possible implementations, a radio frequency (RF) interconnect for an optical modulator may include: a circuit board to route a set of RF signals from a corresponding set of RF feeds to a substrate interface on a surface of a substrate of the optical modulator, where the circuit board may be positioned along the surface of the substrate of the optical modulator, and where the circuit board may include a set of traces, where a trace, of the set of traces, may be connected to a corresponding RF feed, of the set of RF feeds, at a height different than a height of the surface of the substrate of the optical modulator, where the trace may be connected to the substrate interface.

According to some possible implementations, an interconnect may include: an interposer to route a signal from a signal feed to a substrate interface of an optical modulator, where the interposer may be positioned along a surface of a substrate of the optical modulator, and where the interposer may include a trace, where the trace may be connected to the signal feed at a height different than a height of the surface of the substrate of the optical modulator, and where the trace may be connected to the substrate interface.

According to some possible implementations, an electrical interconnect may include: an interposer positioned along a substrate surface of an optical substrate, where the interposer may include a trace associated with routing an electrical signal to an active region of the optical substrate, where the trace may be commenced on the interposer in a plane that is at a different height than a plane corresponding to the substrate surface, and where the trace may connect to a substrate interface of the optical substrate proximal to the active region.

BRIEF DESCRIPTION OF THE DRAWINGS

FIGS. 5A-5E are diagrams depicting an example RF interconnect including a micro-air coaxial stack associated with routing an RF signal.

DETAILED DESCRIPTION

Figure 1:
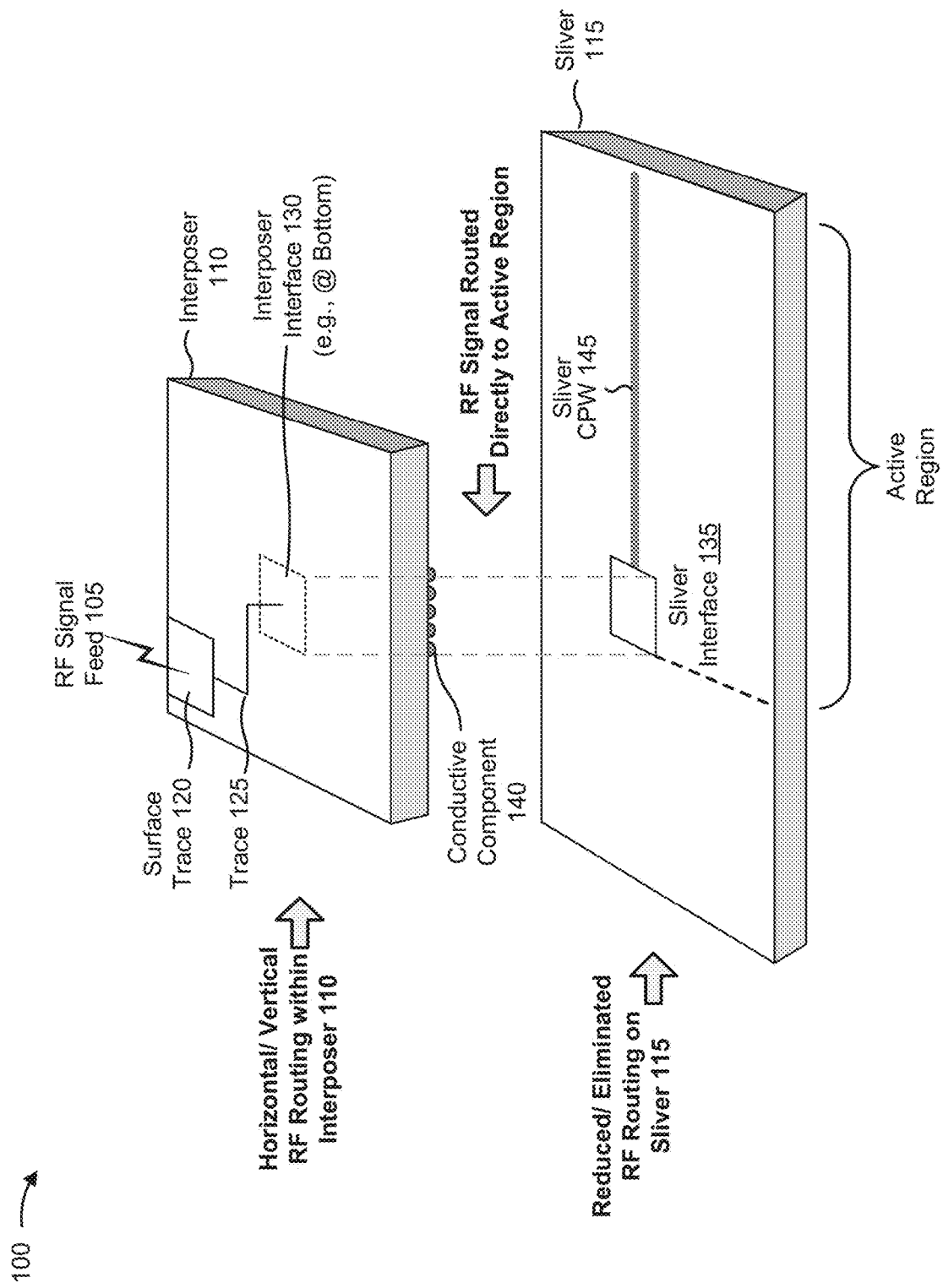
FIG. 1 is a diagram of an overview of an example implementation described herein.

The following detailed description of example implementations refers to the accompanying drawings. The same reference numbers in different drawings may identify the same or similar elements. The implementations described below are merely examples and are not intended to limit the implementations to the precise forms disclosed. Instead, the implementations were selected for description to enable one of ordinary skill in the art to practice the implementations.

A typical RF interconnect may use a combination of coaxial and planar waveguides in order to provide an RF signal to an optical modulator. For example, as described above, the RF signal may be routed through a wall of an optical modulator package using a coaxial feedthrough. The RF signal may then be routed to a co-planar waveguide (CPW), positioned on a ceramic portion (e.g., a package shelf) of the optical modulator package, with which the coaxial feedthrough makes contact (i.e., connects). The RF signal may then be routed (e.g., using a wirebond) to an RF electrode on a substrate of the optical modulator (herein referred to as a sliver), and from the RF electrode to an active region of the sliver (e.g., a region of the sliver in which electro-optical interaction takes place). Here, the RF signal may be routed from the RF electrode to the active region via a CPW on the sliver, where the sliver CPW may include one or more bends.

Typically, the above interfaces (i.e., connections and/or contacts between components) of the RF interconnect are positioned in approximately a same horizontal plane. In other words, the RF interconnect may not include RF routing in a vertical direction. For an optical modulator (e.g., a lithium niobate modulator) designed to receive multiple planar RF signals (e.g., a multi-channel optical modulator), CPWs on the sliver (herein referred to sliver CPWs) may need waveguide sections sufficient to form bends such that the RF signals can be routed to the active region for electro-optical interaction. Here, as the number of RF signals increases, additional and/or increasingly longer RF routing may be needed on the sliver.

The above features of the typical RF interconnect may contribute to RF insertion loss, which may act to reduce an electro-optical bandwidth and/or operational efficiency of the optical modulator. For example, the interfaces of the RF interconnect produce opportunities for RF impedance mismatch, parasitic capacitance, parasitic inductance, RF radiation into the modulator substrate, or the like, which may reduce an amount of RF power reaching the optical modulator.

Implementations described herein may provide various RF interconnects with reduced RF signal path lengths (e.g., as compared to a typical RF interconnect) and/or RF signal paths directly to an active region of a sliver (e.g., such that a need for RF routing on the sliver is reduced and/or eliminated), thereby allowing for reduced RF insertion loss and/or increased optical modulator bandwidth.

In some implementations, RF interconnects, described herein, may include interconnects oriented in a horizontal direction and/or a vertical direction. Additionally, or alternatively, the RF interconnects may include an interposer (e.g., a multi-layer circuit board, a micro-air coaxial stack) capable of routing (e.g., in a horizontal direction, in a vertical direction, three-dimensional routing) an RF signal to an RF electrode positioned at a start of an active region of a sliver with a reduced path length, a reduced amount of loss (e.g., as compared to a typical RF interconnect), and/or with a substantially same skew time for the signal path (e.g., as compared to the typical RF interconnect).

In some implementations, the RF interconnects may include an interposer that may be used to provide a vertical interconnect directly above (or directly below) the RF electrode at the start of the active region of the sliver. As such, a length of RF routing that takes place on the surface of the sliver may be reduced and/or eliminated. In other words, the RF interconnect may guide the RF signal directly to the active region, thereby reducing and/or eliminating a need for RF routing and/or bends in sliver CPWs in front of the active region, which may result in a lower insertion loss.

In some implementations, the RF interconnects, described herein, may be used for RF interconnects associated with a lithium niobate based optical modulator. For example, the RF interconnects may benefit a lithium niobate based optical modulator due to inherit low RF insertion loss, wideband operation, compatible size, interface structure, or the like, associated with lithium niobate. However, the RF interconnects, described herein, may be used to reduce insertion loss and/or increase bandwidth associated with another type of optical modulator, such as an indium phosphate based optical modulator, a gallium arsenide based optical modulator, a silicon photonic based optical modulator, a polymer based optical modulator, or the like.

Notably, while the interconnects described herein are described in the context of RF signals (e.g., a signal within an RF signal band), the interconnects, described herein, may also apply in the context of another type of signal, such as a microwave signal (e.g., a signal within a microwave signal band).

FIG. 1 is a diagram of an overview of example RF interconnect 100 described herein. As shown in FIG. 1, RF interconnect 100 may include an RF signal feed 105, an interposer 110 (e.g., including surface trace 120, trace 125, and interposer interface 130), and a sliver 115 (e.g., including sliver interface 135 and sliver CPW 145). In some implementations, RF interconnect 100 may be housed in an optical modulator package (not shown) via which RF signal feed 105 passes.

RF signal feed 105 may include a feed via which an RF signal is received and/or provided, such as a coaxial feed that passes through the optical modulator package. In some implementations, RF signal feed 105 may receive an RF signal to be provided (e.g., via surface trace 120, trace 125, interposer interface 130, conductive component 140, and sliver interface 135) to sliver CPW 145 for modulation of an optical signal. Notably, while the RF interconnects described herein are described in the context of an RF signal being provided from RF signal feed 105 to sliver CPW 145 (e.g., for purposes of modulating an optical signal).

In some implementations, RF signal feed 105 may be a horizontal feed (e.g., such that a direction of the RF signal feed is substantially parallel to a plane corresponding to a top and/or a bottom surface of interposer 110 and/or sliver 115) or a vertical feed (e.g., such that a direction of the RF signal feed is substantially perpendicular to the plane corresponding to the top and/or the bottom surface of interposer 110 and/or sliver 115), as described elsewhere herein.

Additionally, or alternatively, RF signal feed 105 may be positioned at a side of interposer 110 (e.g., at an edge of a top surface of interposer 110, as shown in FIG. 1A) or over a middle portion of interposer 110 (e.g., away from the edge of the top surface of interposer 110, toward a center of the top surface of interposer 110).

Interposer 110 may include a component capable of routing (e.g., in a vertical direction, in a horizontal direction) the RF signal from RF signal feed 105 to sliver interface 135 of sliver 115 (e.g., across a height of interposer 110). For example, interposer 110 may include a single layer circuit board, a multilayer circuit board (sometimes referred to as a multilayer routing board or a multilayer ceramic), a micro-air coaxial stack, or the like, that includes traces 125 (e.g., ground traces, signal traces) associated with routing the RF signal. In some implementations, an amount of RF loss, associated with interposer 110 (e.g., an amount of loss associated with routing the RF signal on or within a substrate of interposer 110) may be less than an amount of RF loss associated with sliver 115 (e.g., an amount of loss associated with routing the RF signal on and/or within sliver 115). The term height, as used herein, may be refer a distance in a direction from a surface of interposer 110 that includes surface trace 120 to a surface of sliver 115 that includes sliver interface 135 and/or a surface of interposer 110 that includes interposer interface 130. Additional details regarding various types of interposers 110 are described elsewhere herein.

As shown, in some implementations, interposer 110 may be positioned with respect to sliver 115. For example, interposer 110 may be positioned on or over sliver 115 (i.e., interposer 110 may be positioned on top of or above sliver 115) when sliver interface 135 is located on a top surface of sliver 115, as shown in FIG. 1A. As another example, interposer 110 may be positioned under sliver 115 (e.g., interposer 110 may be positioned on bottom of or under sliver 115) when sliver interface is located on a bottom surface of sliver 115 (e.g., in the case of a flip-chip configuration). As another example, interposer 110 may be positioned on a side of sliver or sliver 115 (e.g., when sliver interface 135 is located on a left side, a right side, a front side, or a back side of sliver 115). As shown, in some implementations, interposer may be positioned over sliver 115 (i.e., interposer 110 may be positioned on top of sliver 115). Additionally, or alternatively, interposer may be positioned under sliver 115 (e.g., in the case of a flip-chip configuration).

In some implementations, RF signal feed 105 may contact surface trace 120 of interposer 110. Surface trace 120 may include metallization (e.g., a set of ground-signal-ground (GSG) traces, a bond pad, metallization on a surface of interposer 110, or the like), positioned on a surface of interposer 110, via which the RF signal may be received from RF signal feed 105. In some implementations, surface trace 120 may connect to trace 125 such that the RF signal may be routed (e.g., within interposer 110) to interposer interface 130.

As further shown, trace 125 may connect surface trace 120 and interposer interface 130. In some implementations, trace 125 may route the RF signal in a vertical direction and/or a horizontal direction, within interposer 110, en route to interposer interface 130. In some implementations, trace 125 may include a set of GSG traces, a stripline, a microstrip, a via, a horizontal trace, a vertical trace, or the like. In some implementations, traces 125 may be positioned in one or more planes of interposer 110 (e.g., horizontal cross-sectional planes of interposer 110 that correspond to one or more layers of interposer 110). As such, when interposer 110 is positioned above or below sliver 115, traces 125 may be positioned in one or more planes that are above or below the surface of sliver 115 In other words, traces 125 may be positioned in one or more planes that are above or below a plane corresponding to the surface of sliver 115 and/or sliver interface 135. In this way, routing of the RF signal may take place within interposer 110 (e.g., rather than on sliver 115) thereby reducing RF loss that may otherwise result from RF signal routing on sliver 115. As shown, trace 125 may connect to interposer interface 130 (e.g., at a bottom surface of interposer 110, at a surface that is opposite to a surface on which surface trace 120 is positioned).

Interposer interface 130 may include an interface of interposer 110 via which the RF signal is passed between interposer 110 and sliver 115. For example, interposer interface 130 may include a set of surface traces, such as a set of bond pads, a set of GSG traces or the like. In some implementations, a shape and/or configuration of interposer interface 130 may match a shape and/or configuration of sliver interface 135, as described elsewhere herein. In some implementations, interposer interface 130 may connect to sliver interface 135 via conductive component 140 (e.g., a micro bump array, a conductive micro-pipe array, a wire bond) such that the RF signal may pass from interposer interface 130 to sliver interface 135.

Sliver interface 135 may include an interface of sliver 115 (sometimes referred to as a substrate interface) via which the RF signal is passed between interposer 110 and sliver 115. For example, sliver interface 135 may include a set of surface traces, such as a set of RF electrodes, a set of GSG traces, or the like. In some implementations, a shape and/or configuration of sliver interface 135 may match a shape and/or configuration of interposer interface 130, as described elsewhere herein.

In some implementations, traces of interposer 110 (e.g., surface trace 120, trace 125, traces of interposer interface 130, traces of sliver interface 135, or the like) may include one or more signals trace with one or more ground traces arranged around (e.g., adjacent to, surrounding, partially surrounding) the one or more signal traces. Any arrangement of a ground trace arranged around a signal trace may be used in the implementations described herein.

As shown, in some implementations, sliver interface 135 may be positioned at a start of or within an active region of sliver 115. For example, sliver interface 135 may be positioned such that the RF signal may be provided directly to sliver CPW 145 located in the active region of sliver 115. In other words, in some implementations, sliver interface 135 may be positioned such that a need for RF routing on sliver 115 needed to reach the active region is reduced or eliminated (e.g., as compared to the typical RF interconnect).

In this way, an RF interconnect may provide for a reduced RF signal path length (e.g., as compared to a typical RF interconnect) and/or an RF signal path directly connected to an active region of a sliver, thereby allowing for reduced RF insertion loss and/or increased optical modulator bandwidth.

The number, arrangement, position, orientation, size, and the like, of features and components shown in FIG. 1 are provided as examples. In practice, RF interconnect 100 may include additional features and/or components, fewer features and/or components, different features and/or components, differently arranged features and/or components, differently positioned features and/or components, differently oriented features and/or components, or differently sized features and/or components than those shown in FIG. 1. For example, while RF interconnect 100 is shown as including a set of features and components associated with a single RF signal, RF interconnect 100 may include multiple sets of features and components associated with multiple RF signals (e.g., four RF signals, eight RF signals, sixteen RF signals) when, for example, the optical modulator has multiple branches and/or is a multi-channel optical modulator. In the case of a multi-channel optical modulator, as a number of channels increases (e.g., as a number of sets of the above described features and components increases), a reduction in insertion loss and/or an increase in optical modulator bandwidth may also occur. Various particular implementations of RF interconnect 100 are described below.

Additionally, or alternatively, a set of features and/or a set of components (e.g., one or more features and/or one or more components) of RF interconnect 100 may perform one or more functions described as being performed by another set of features and/or another set of components of RF interconnect 100.

FIGS. 2A-2E are diagrams depicting example RF interconnects 200 and 250 including a multilayer circuit board and a sliver with matching patterned interfaces associated with routing RF signals.

Figure 2A:
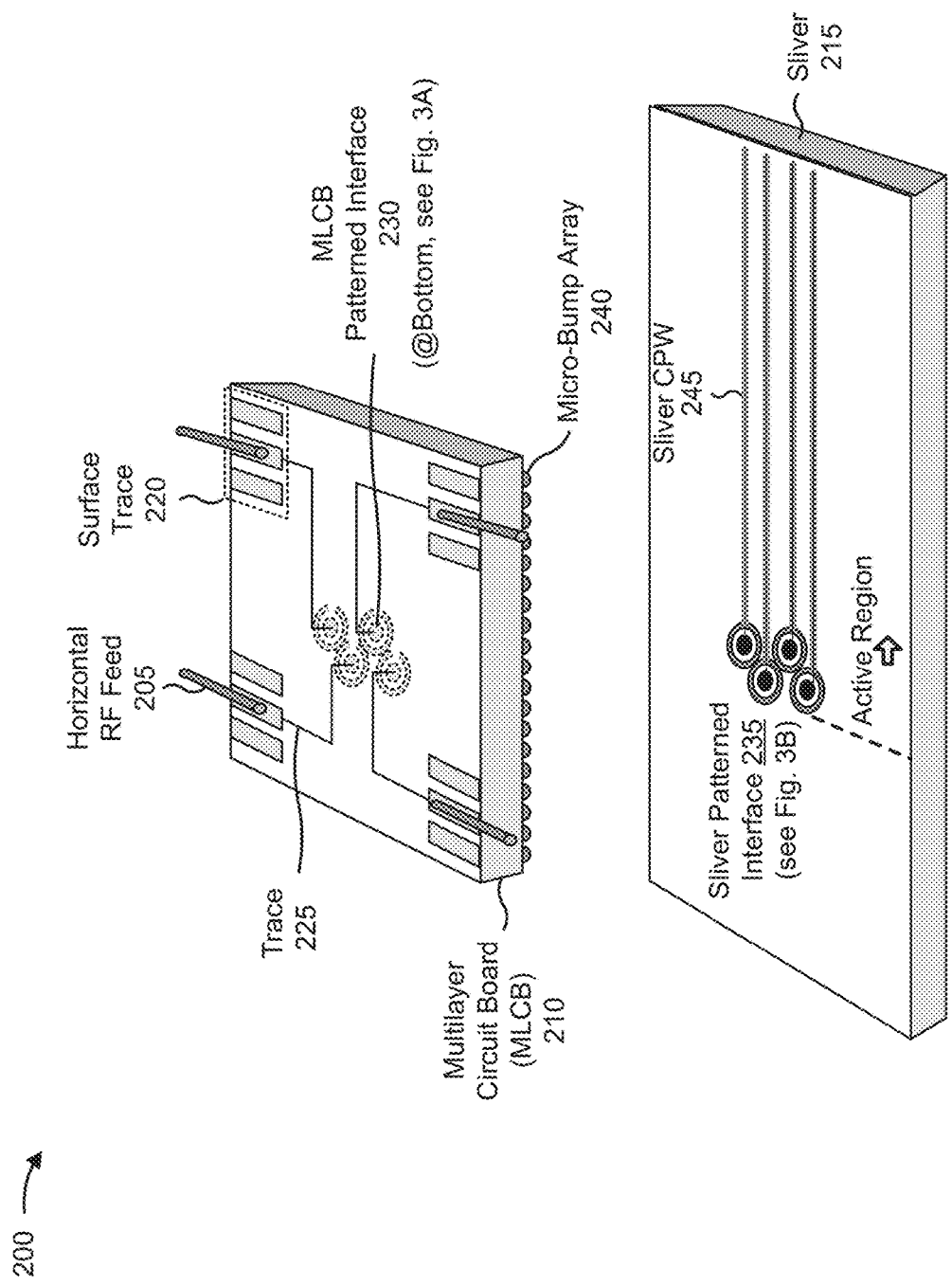
FIGS. 2A-2E are diagrams depicting example RF interconnects including a multilayer circuit board and a sliver with matching patterned interfaces associated with routing RF signals.

FIG. 2A is a diagram depicting example RF interconnect 200 including a set of horizontal coaxial RF signal feeds. As shown in FIG. 2A, RF interconnect 200 may include a set of horizontal RF feeds 205, multilayer circuit board 210, and sliver 215. Horizontal RF feed 205, multilayer circuit board 210, and sliver 215 may correspond to RF signal feed 105, interposer 110, and sliver 115, respectively, as described above with respect to FIG. 1.

As shown in FIG. 2A, the set of horizontal RF feeds 205 may include one or more coaxial interconnects positioned at one or more sides of multilayer circuit board 210. As shown, the set of horizontal RF feeds 205 may be positioned such that directions in which RF signals, provided via horizontal RF feeds 205, are substantially parallel to a plane corresponding to a top and/or a bottom surface of multilayer circuit board 210 and/or sliver 215.

In some implementations, RF interconnect 200 may include one or more horizontal RF feeds 205. For example, RF interconnect 200 may include one horizontal RF feed 205, two horizontal RF feeds 205, four horizontal RF feeds 205 (e.g., as shown in FIG. 2A), eight horizontal RF feeds 205, sixteen horizontal RF feeds 205, or the like. Additionally, or alternatively, horizontal RF feeds 205 of RF interconnect 200 may be positioned at one or more sides of multilayer circuit board 210. For example, RF interconnect 200 may include a first set of horizontal RF feeds 205 (e.g., one, two, four, eight) at a first side of multilayer circuit board 210 and a second set of horizontal RF feeds 205 at a second side (e.g., a side opposite from first side, a side adjacent to the first side) of multilayer circuit board 210. As another example, all horizontal RF feeds 205 may be positioned at a single side of multilayer circuit board 210. In some implementations, the configuration and/or arrangement of other components of multilayer circuit board 210 (e.g., GSG traces 220, traces 225, multilayer circuit board patterned interface 230) may vary in order to match the number and/or arrangement of horizontal RF feeds 205.

As shown, horizontal RF feeds 205 may be positioned on (i.e., may contact) surface traces 220 on a surface of multilayer circuit board 210. Surface trace 220 may correspond to surface trace 120 described above with respect to FIG. 1. In some implementations, RF signals may be provided to surface traces 220 via corresponding horizontal RF feeds 205. Notably, for purposes of clarity, only connections and routing associated with the signal portions of surface traces 220 are shown in FIG. 2A.

As shown, multilayer circuit board 210 may include surface traces 220. In some implementations, multilayer circuit board 210 may include surface traces 220 on a first surface of multilayer circuit board 210, traces 225 within multilayer circuit board 210, and multilayer circuit board patterned interface 230 on a second surface of multilayer circuit board 210. In some implementations, multilayer circuit board 210 may include a layered circuit board that includes conductive portions (e.g., surface traces 220, traces 225, multilayer circuit board patterned interface 230) and non-conductive portions (e.g., layers of dielectric material that support or surround the conductive portions). For example, multilayer circuit board 210 may include a co-fired ceramic device, such as a high temperature co-fired ceramic (HTCC) device or a low temperature co-fired ceramic (LTCC) device.

As further shown, traces 225, included in multilayer circuit board 210, may connect to surface traces 220 for routing the RF signals through multilayer circuit board 210. Trace 225 may correspond to trace 125 described above with respect to FIG. 1. For example, trace 225 may include a GSG trace, a stripline (e.g., on a surface of multilayer circuit board 210), and/or a microstrip (e.g., within a substrate of multilayer circuit board 210). As shown, traces 225 may connect surface traces 220 to multilayer circuit board patterned interface 230 (e.g., located on a surface opposite from the surface on which surface traces 220 are located) in order to allow the RF signals to be routed from surface traces 220 to corresponding portions of multilayer circuit board patterned interface 230.

Multilayer circuit board patterned interface 230 may correspond to interposer interface 130 described above with respect to FIG. 1. In some implementations, multilayer circuit board patterned interface 230 may include a set of traces, on a bottom surface of multilayer circuit board 210, where each trace may include a signal portion (e.g., an inner circular portion shown by the dotted circular shapes on the bottom surface of multilayer circuit board 210 in FIG. 2A) and a corresponding ground portion (e.g., a partial ring-shaped portion surrounding the inner circular portions, as shown by the dotted partial ring-shapes in FIG. 2A). In some implementations, the ground portion may be designed to surround the signal portion in order to isolate the RF signal, thereby improving transfer of the RF signal from multilayer circuit board patterned interface 230 to sliver patterned interface 235.

In some implementations, the RF signals may be provided from multilayer circuit board 210 to sliver 215 via multilayer circuit board patterned interface 230. For example, as shown, the RF signals may be provided from multilayer circuit board patterned interface 230 via micro-bump array 240 positioned between multilayer circuit board 210 and sliver 215. Micro-bump array 240 may correspond to conductive component 140 as described above with regard to FIG. 1. In some implementations, micro-bump array 240 may include a set of electrically conductive elements that allow the RF signals to be passed from multilayer circuit board patterned interface 230 to sliver patterned interface 235. For example, micro-bump array 240 may include a set of copper pillars (e.g., arranged in a grid-like or customized pattern) (sometimes referred to as a set of micro-copper pillars). In some implementations, micro-bump array 240 may be attached to multilayer circuit board 210 and/or sliver 215.

Sliver patterned interface 235 may correspond to sliver interface 135 described above with respect to FIG. 1. In some implementations, sliver patterned interface 235 may include a set of RF electrodes on a surface of sliver 215 via which the RF signals may be provided directly to sliver CPWs 245 located in an active region of sliver 215. For example, in some implementations, sliver patterned interface 235 may include a set of RF electrodes positioned on a surface of sliver 215, where each RF electrode may include a signal portion (e.g., an inner circular portion shown by the solid circular shapes on the top surface of sliver 215 in FIG. 2A) and a corresponding ground portion (e.g., a partial ring-shaped portion surrounding the inner circular portion, as shown by the solid partial ring-shapes in FIG. 2A). In some implementations, the ground portion may be designed to surround the signal portion in order to isolate the RF signal, thereby improving transfer of the RF signal from multilayer circuit board patterned interface 230 to sliver patterned interface 235.

The RF signals may be provided from multilayer circuit board patterned interface 230 to sliver patterned interface 235 when micro-bump array 240 contacts both multilayer circuit board patterned interface 230 and sliver patterned interface 235 (i.e., when the bottom surface of multilayer circuit board 210 is placed on the top surface of sliver 215, with micro-bump array 240 in between). In other words, the RF signals may be provided via micro-bumps of micro-bump array 240. Here, a particular RF signal may pass from a portion of multilayer circuit board patterned interface 230 to a corresponding portion of sliver patterned interface 235 (e.g., the portion of sliver patterned interface 235 that is directly below the portion of multilayer circuit board patterned interface 230) via one or more micro-bumps that contact both the portion of multilayer circuit board patterned interface 230 and the portion of sliver patterned interface 235.

Notably, RF interconnect 200 describes the means via which the RF signals are provided from multilayer circuit board patterned interface 230 to sliver interface 235 as being micro-bump array 240, in some implementations, the RF signals may be provided in another manner, such as via a micro-pipe array that includes a set of electrically conductive micro-pipes surrounded by a non-conductive material.

As further shown in FIG. 2A, in some implementations, multilayer circuit board patterned interface 230 may match sliver patterned interface 235. As such, the RF signals may be provided directly to sliver patterned interface 235 from multilayer circuit board patterned interface 230 (via micro-bump array 240). Additional, details regarding multilayer circuit board patterned interface 230 and sliver patterned interface 235 are described below with regard to FIGS. 3A-3D.

As further shown in FIG. 2A, RF electrodes of sliver patterned interface 235 may be positioned at a start of or within an active region of sliver 215. As further shown, each RF electrode of sliver patterned interface 235 may connect to a corresponding sliver CPW 245. Sliver CPW 245 may correspond to sliver CPW 145 described above with respect to FIG. 1. Notably, with respect to RF interconnect 200, the RF signals are provided directly to the RF electrodes at the start of or within the active region of sliver 215, thereby eliminating a need for RF routing on sliver 215 in order to reach the active region. As such, RF interconnect 200 may use multilayer circuit board 210 to eliminate a need for RF routing to reach the active region. Similarly, RF interconnect 200 may eliminate and/or reduce a need for CPW bends on sliver 215 that are needed in a planar CPW configuration of the typical RF interconnect. This may allow for reduced RF loss and/or increased modulator bandwidth (as compared to the typical RF interconnect). Moreover, a signal path length (e.g., from horizontal RF feed 205 to sliver CPW 245), associated with RF interconnect 200, may be reduced (as compared to the typical RF interconnect) due the use of multilayer circuit board 210, thereby allowing for further reduced RF loss and/or increased modulator bandwidth.

Figure 2B:
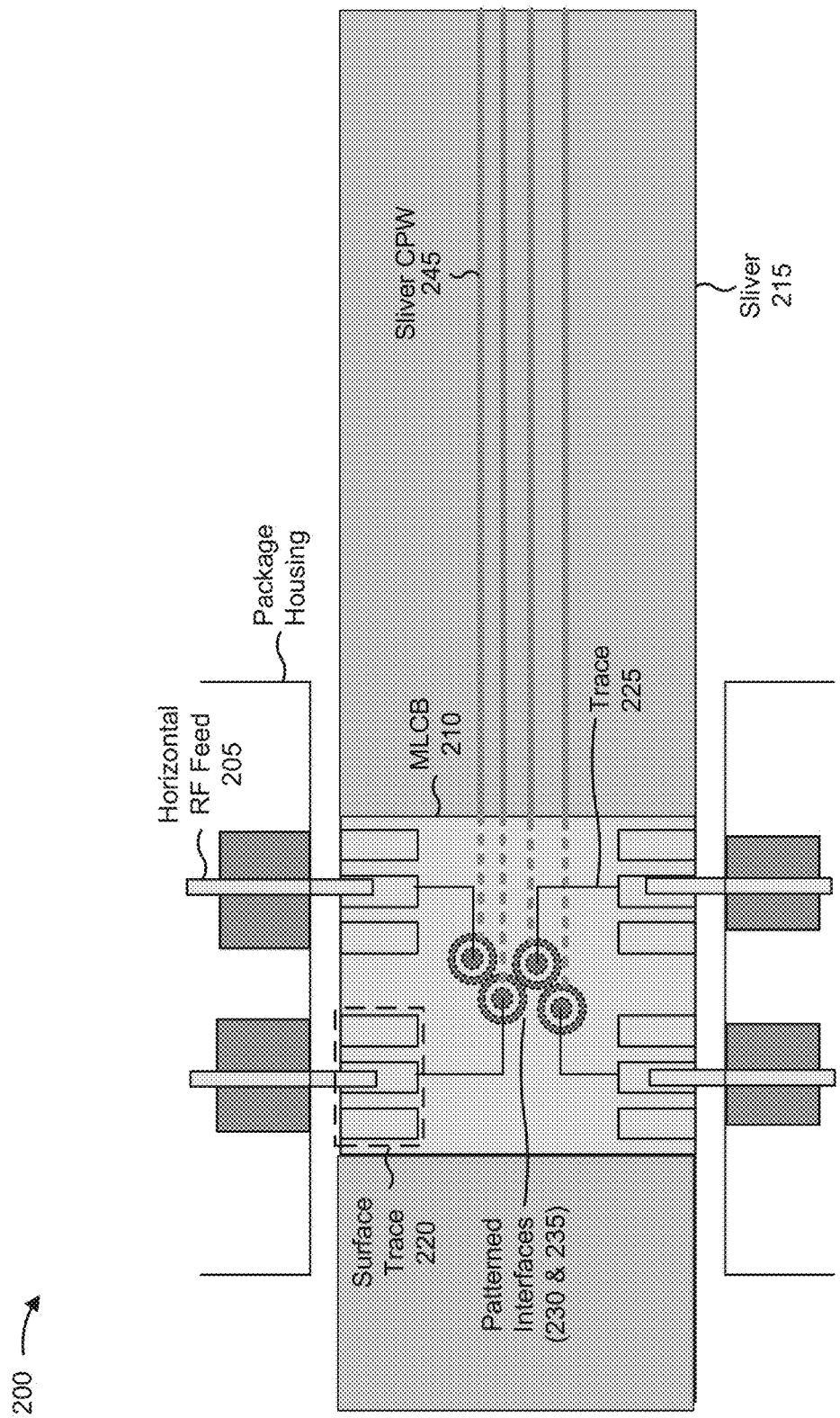

FIG. 2B is a diagram of an example top view of RF interconnect 200. As shown in FIG. 2B, multilayer circuit board 210 may be placed on sliver 215 such that multilayer circuit board patterned interface 230 is positioned aligned with (e.g., directly over, directly under) sliver patterned interface 235. Here, bumps of micro-bump array 240 (not shown) may allow the RF signals to be routed from multilayer circuit board patterned interface 230 directly to sliver patterned interface 235 (i.e., to the RF electrodes positioned at the start of or within the active area of sliver 215) after the RF signals are routed from horizontal RF feeds 205 within multilayer circuit board 210 (e.g., via surface traces 220 and trace 225). Performing RF routing within multilayer circuit board 210 may lead to reduced RF loss, where an amount of RF loss resulting from routing within multilayer circuit board 210 is less than an amount of RF loss that would result from routing on sliver 215 (as with the typical RF interconnect).

Figure 2C:
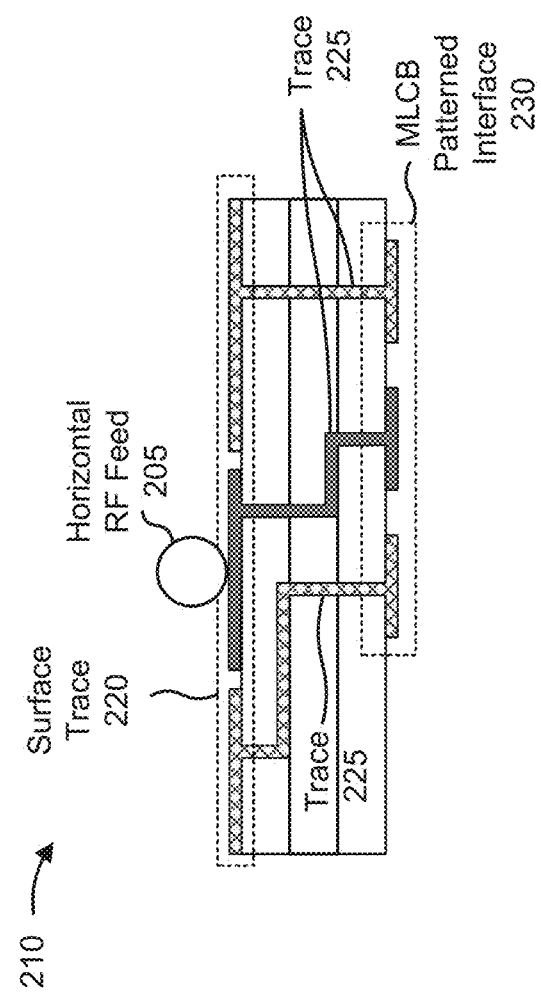

FIG. 2C is a diagram of an example cross section of a portion of multilayer circuit board 210 corresponding to a single RF signal. As shown in FIG. 2C, surface trace 220 of multilayer circuit board 210 may be positioned on a top surface of multilayer circuit board 210, and may contact horizontal RF feed 205, as described herein. As further shown, traces 225 of multilayer circuit board 210 may connect surface trace 220 to a corresponding portion of multilayer circuit board patterned interface 230 at a bottom of multilayer circuit board 210. As shown, traces 225 may be arranged to provide RF routing in a horizontal direction and/or a vertical direction within multilayer circuit board 210. As shown, bends (e.g., 90 degree bend) in traces 225 may occur at different heights (e.g., at different layers) within multilayer circuit board 210.

Figure 2D:
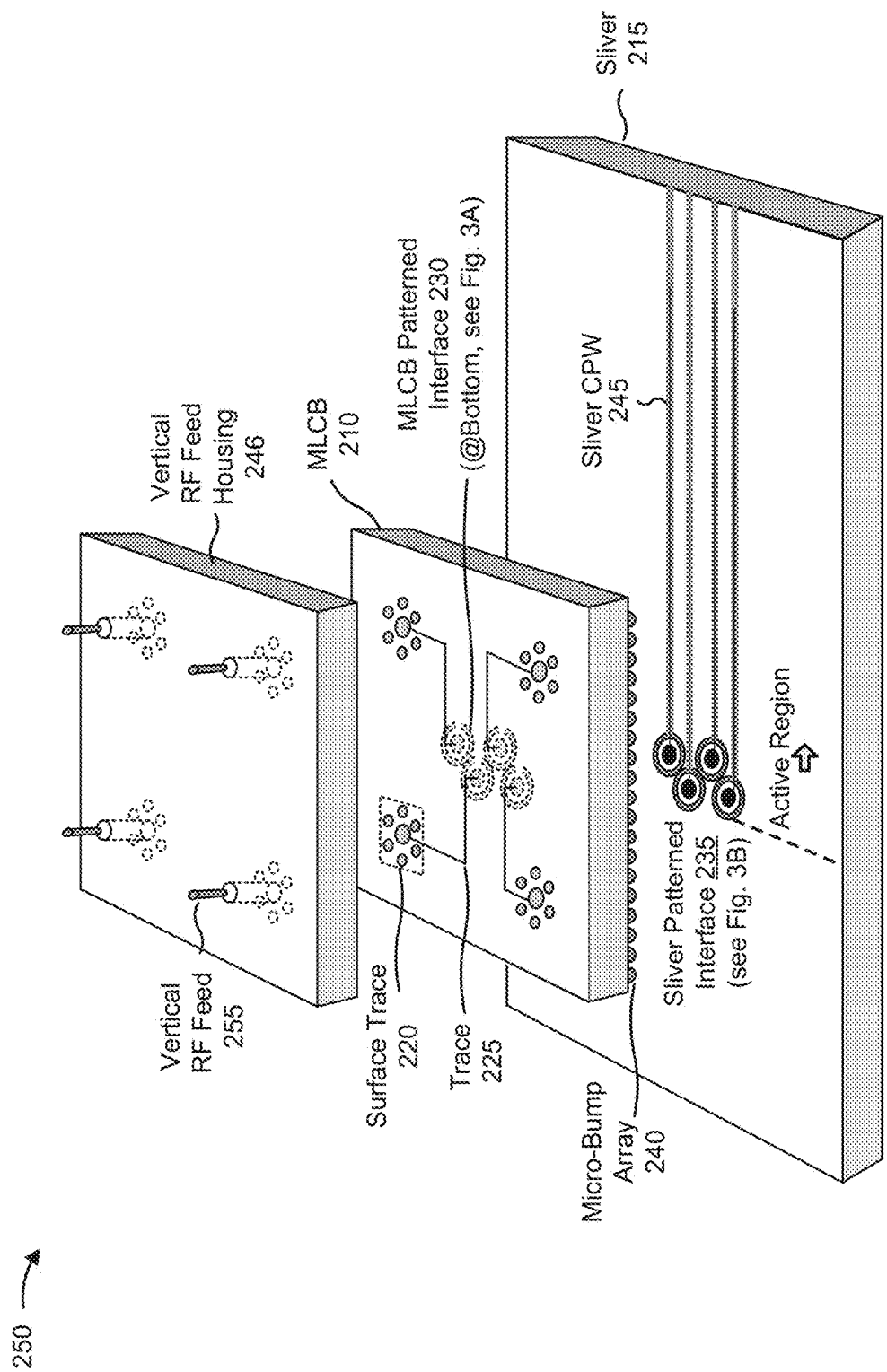

FIG. 2D is a diagram depicting example RF interconnect 250 including a set of vertical coaxial RF signal feeds. As shown in FIG. 2D, RF interconnect 250 may include a set of vertical RF feeds 255 (rather than horizontal RF feeds 205) housed in a vertical RF feed housing 246, multilayer circuit board 210, and sliver 215. Vertical RF feed 255 may correspond to RF signal feed 105 as described above with respect to FIG. 1.

As shown in FIG. 2D, the set of vertical RF feeds 255 may include one or more coaxial interconnects positioned over a top surface of multilayer circuit board 210. As shown, the set of vertical RF feeds 255 may be positioned such that directions in which RF signals, provided via vertical RF feeds 255, are substantially perpendicular to a plane corresponding to a top and/or a bottom surface of multilayer circuit board 210 and/or sliver 215. In some implementations, a set of vertical RF feeds 255 may be housed in a vertical RF feed housing 246. In some implementations, each vertical RF feed 255 may be held in place in vertical RF feed housing 246 using a connector, such as a spring loaded connector. In some implementations, vertical RF feeds 255 may pass through vertical RF feed housing 246 such that RF signals may be provided to multilayer circuit board 210. As shown, in some implementations, an arrangement of vertical RF feeds 255 of vertical RF feed housing 246 may match an arrangement of surface traces 220 of multilayer circuit board 210 (e.g., such that RF signals may be provided directly to surface traces 220 in a vertical direction).

In some implementations, RF interconnect 250 may include one or more vertical RF feeds 255. For example, RF interconnect 250 may include one vertical RF feed 255, two vertical RF feeds 255, four vertical RF feeds 255 (e.g., as shown in FIG. 2D), eight vertical RF feeds 255, sixteen vertical RF feeds 255, or the like. Additionally, or alternatively, vertical RF feeds 255 of RF interconnect 250 may be positioned in a pattern on the top surface of multilayer circuit board 210. For example, RF interconnect 250 may include a set of two or more vertical RF feeds 255 arranged in a linear patter, a circular pattern, an elliptical pattern, a square pattern, a triangular pattern, a rectangular pattern, or the like. Additionally, or alternatively, the set of vertical RF feeds may be arranged in another manner (e.g., randomly, without a pattern). In some implementations, the configuration and/or arrangement of other components of multilayer circuit board 210 (e.g., surface traces 220, traces 225, multilayer circuit board patterned interface 230) may vary in order to match the number and/or arrangement of vertical RF feeds 255.

As shown, vertical RF feed housing 246 may be positioned such that vertical RF feeds 255 connect to (i.e., contact) surface traces 220 on a surface of multilayer circuit board 210. In some implementations, RF signals may be provided to signal portions of surface traces 220 via corresponding vertical RF feeds 255. As shown in FIG. 2D, in the case of RF interconnect 250 that includes vertical RF feeds 255, surface traces 220 may include a signal portion (e.g., a larger inner circular portion, a center conductor) surrounded by a set of ground portions (e.g., multiple smaller outer circular portions, a via array) which may encapsulate an electric field, associated with the RF signal, thereby allowing for improved impedance matching at connections between vertical RF feeds 255 and surface traces 220. Notably, for purposes of clarity, only connections and routing associated with the signal portions of surface traces 220 are shown in FIG. 2D.

For the purposes of example, RF interconnect 250, traces 225, multilayer circuit board patterned interface 230, sliver patterned interface 235, micro-bump array 240, and sliver CPWs 245 may be arranged, configured, designed, or the like, in a manner similar to that described above with regard to RF interconnect 200.

With regard to RF interconnect 250, in some implementations, vertical RF feeds 255, surface traces 220, multilayer circuit board patterned interface 230, and sliver patterned interface 235 may be arranged such that only vertical routing of the RF signals is needed. In other words, in some implementations, RF interconnect 250 may be designed such that no significant length (e.g., less than approximately 1 millimeter) of horizontal routing is needed. For example, sliver patterned interface 235 may be designed such that each RF electrode of sliver patterned interface 235 is directly below a corresponding vertical RF feed 255. Such elimination or minimization of horizontal routing and/or bends in the RF routing may allow for a further reduction of RF loss and/or a further increase in modulator bandwidth (e.g., as compared to the typical RF interconnect).

As with RF interconnect 200, the RF signals provided via RF interconnect 250 are provided directly to the RF electrodes at the start of or within the active region of sliver 215, thereby eliminating a need for RF routing on sliver 215. As such, RF interconnect 250 may use multilayer circuit board 210 to eliminate a need for RF routing to reach the active region. Similarly, RF interconnect 250 may eliminate and/or reduce a need for CPW bends on sliver 215 that are needed in a planar CPW configuration of the typical RF interconnect. This may allow for reduced RF loss and/or increased modulator bandwidth (as compared to the typical RF interconnect). Moreover, a signal path length (e.g., from vertical RF feed 255 to sliver CPW 245), associated with RF interconnect 250, may be reduced due the use of multilayer circuit board 210 and/or the use of vertical RF feeds 255, thereby allowing for further reduced RF loss and/or increased modulator bandwidth. In some implementations, vertical RF feeds 255 reduce the signal path length more than implementations having horizontal RF feeds 205.

Figure 2E:
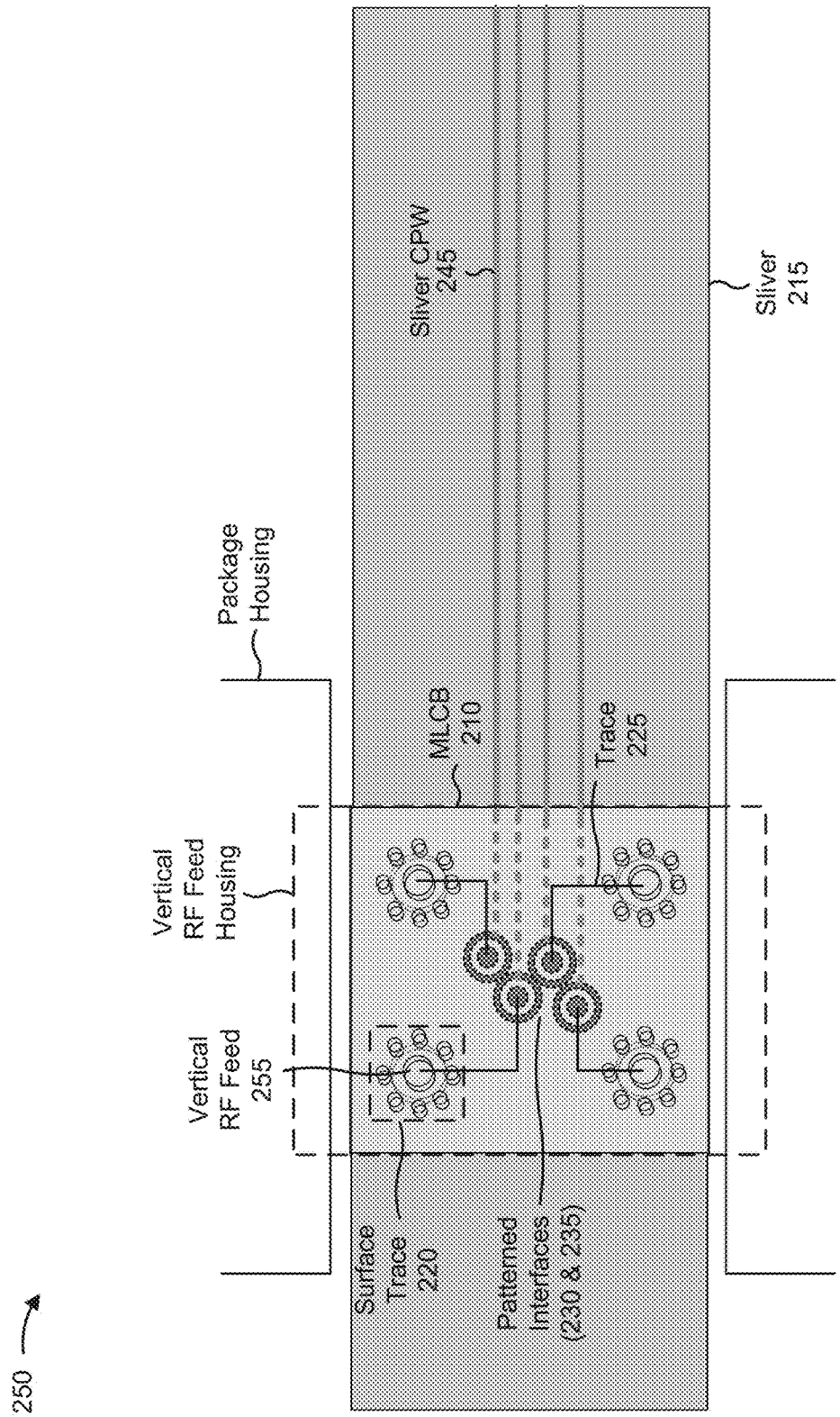

FIG. 2E is a diagram of an example top view of RF interconnect 250. As shown in FIG. 2E, multilayer circuit board 210 may be placed on sliver 215 such that multilayer circuit board patterned interface 230 is aligned with sliver patterned interface 235. Here, bumps of micro-bump array 240 (not shown) may allow the RF signals to be routed from multilayer circuit board patterned interface 230 directly to sliver patterned interface 235 (i.e., the RF electrodes positioned at the start of the active area of sliver 215) after the RF signals are routed from vertical RF feeds 255 within multilayer circuit board 210 (e.g., via surface traces 220 and trace 225). Notably, surface traces 220 of are shown as being slightly misaligned with respect to the arrangement of an interface of vertical RF feeds 255 of vertical RF feed housing 246 in order to illustrate a matching interface configuration between vertical RF feed housing 246 (i.e., vertical RF feeds 255 of vertical RF feed housing 246) and the top surface of multilayer circuit board 210 (i.e., surface traces 220 of multilayer circuit board 210). Performing RF routing within multilayer circuit board 210 may lead to reduced RF loss (e.g., as compared to RF routing on sliver 215, as with the typical RF interconnect).

In some implementations, a cross section of multilayer circuit board 210 associated with a single vertical RF feed 255 may be similar to the cross section described above with regard to FIG. 2C with the notable exception that horizontal RF feed 205 is replaced by vertical RF feed 255.

The number, arrangement, position, orientation, size, and the like, of features and components shown in FIGS. 2A-2E are provided as examples. In practice, RF interconnect 200 and/or RF interconnect 250 may include additional features and/or components, fewer features and/or components, different features and/or components, differently arranged features and/or components, differently positioned features and/or components, differently oriented features and/or components, or differently sized features and/or components than those shown in FIGS. 2A-2E. Additionally, or alternatively, a set of features and/or a set of components (e.g., one or more features and/or one or more components) of RF interconnect 200 and/or RF interconnect 250 may perform one or more functions described as being performed by another set of features and/or components of RF interconnect 200 and/or RF interconnect 250.

FIGS. 3A-3D are diagrams depicting example multilayer circuit board patterned interface 230 and example sliver patterned interfaces 235 on a surface of a multilayer circuit board 210 and a surface of a sliver 215.

Figure 3A:
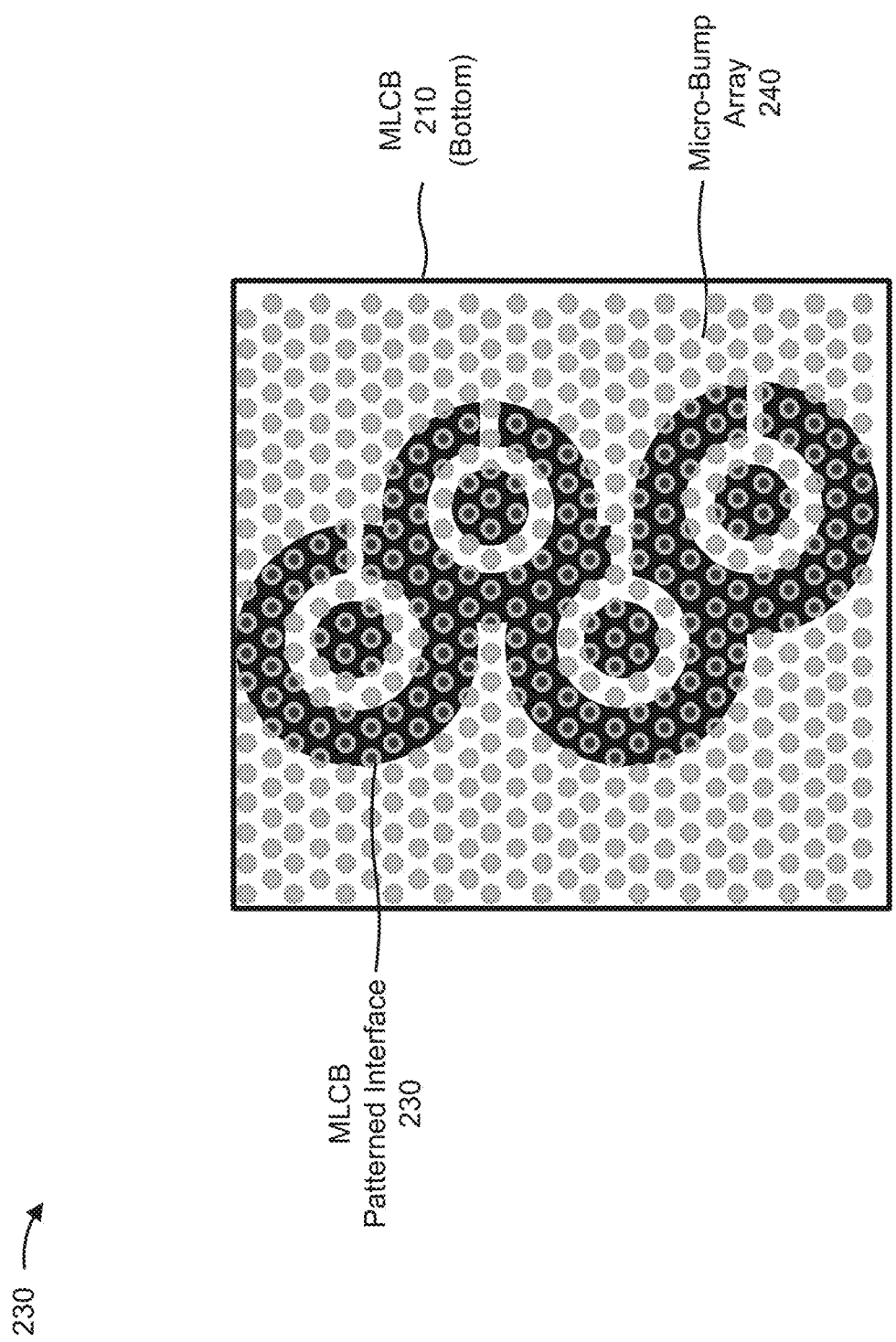
FIGS. 3A-3D are diagrams depicting an example multilayer circuit board patterned interface and example sliver patterned interfaces on a surface of a multilayer circuit board and a surface of a sliver.

FIG. 3A is a diagram of an example multilayer circuit board patterned interface 230. As described above, multilayer circuit board patterned interface 230 may be located on a bottom surface of multilayer circuit board 210 associated with RF interconnect 200 or RF interconnect 250.

As shown, multilayer circuit board patterned interface 230 may include a set of traces (e.g., on a bottom surface of multilayer circuit board 210) where each trace may include a signal portion (e.g., an inner circular portion) and a corresponding ground portion (e.g., a partial ring-shaped portion surrounding the inner circular portion). As shown, in some implementation, ground portions of one or more traces may overlap within multilayer circuit board patterned interface 230.

As shown, micro-bumps of micro-bump array 240 may be arranged in a grid-like pattern. As further shown, a first set of micro-bumps of micro-bump array 240 may contact (e.g., partially, fully) signal portions of the traces of multilayer circuit board patterned interface 230. As also shown, a second set of micro-bumps of micro-bump array 240 may contact ground portions of the traces of multilayer circuit board patterned interface 230. As shown, a third set of micro-bumps of micro-bump array 240 may not contact any signal or ground portion of multilayer circuit board patterned interface 230. The micro-bumps of micro-bump array 240 are sized and/or positioned such that a single micro-bump does not contact both a signal portion and a ground portion of multilayer circuit board patterned interface 230.

Figure 3B:
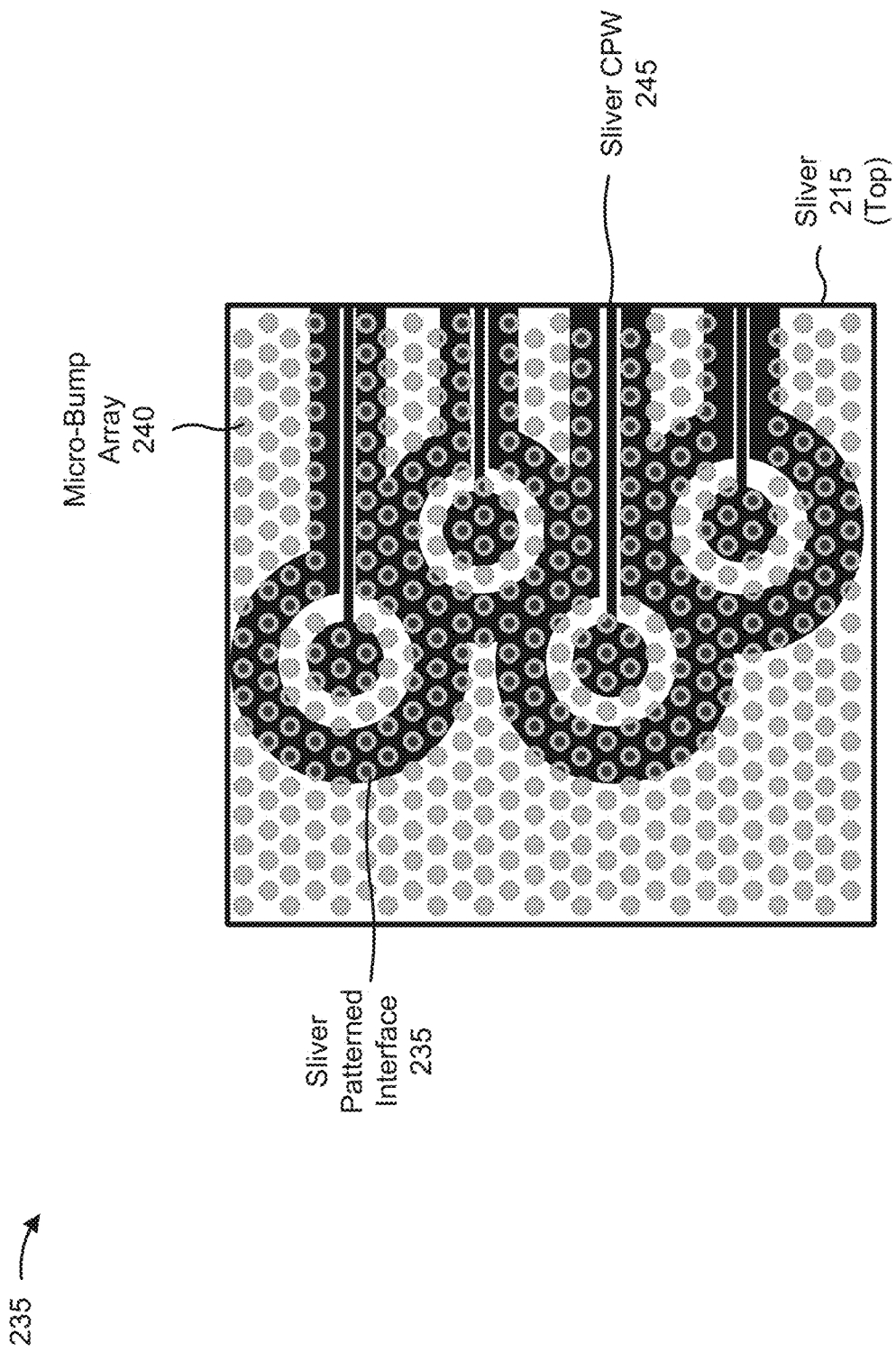

FIG. 3B is a diagram of an example sliver patterned interface 235. As described above, sliver patterned interface 235 may be located on a top surface of sliver 215 associated with RF interconnect 200 or RF interconnect 250.

As shown, sliver patterned interface 235 may include a set of traces (e.g., on a top surface of sliver 215) where each trace may include a signal portion (e.g., an inner circular portion) and a corresponding ground portion (e.g., a partial ring-shaped portion surrounding the inner circular portion). In some implementations, a width of a trace (e.g., the signal portion) of multilayer circuit board patterned interface 230 may be greater than a width of a trace of sliver patterned interface 235. As shown, in some implementations, ground portions of one or more traces may overlap within sliver patterned interface 235. As further shown, signal portions of sliver CPWs 245 may connect to the signal portions of sliver patterned interface 235 (e.g., such that the RF signals may be provided to sliver CPWs 245), and ground portions of sliver CPWs 245 may connect to the ground portions of sliver patterned interface 235. In some implementations, micro-bump array 240 may be attached to and/or contact sliver 215 and/or multilayer circuit board 210.

As further shown, micro-bump array 240 may include a uniform or grid-like pattern array. As shown, a first set of micro-bumps of micro-bump array 240 may contact (e.g., partially, fully) signal portions of the traces of sliver patterned interface 235. As also shown, a second set of micro-bumps of micro-bump array 240 may contact ground portions of the traces of sliver patterned interface 235. As shown, a third set of micro-bumps of micro-bump array 240 may not contact any signal or ground portion of sliver patterned interface 235. The micro-bumps of micro-bump array 240 are sized and/or positioned such that a single micro-bump does not contact both a signal portion and a ground portion of sliver patterned interface 235. Here, an RF signal may be provided from multilayer circuit board patterned interface 230 to sliver patterned interface 235 via one or more micro-bumps that contact both a signal portion of a trace on multilayer circuit board patterned interface 230 and a corresponding signal portion of a corresponding trace on sliver patterned interface 235.

As illustrated by FIGS. 3A and 3B, in some implementations, a pattern and arrangement of traces on multilayer circuit board patterned interface 230 may match a pattern and arrangement of traces on sliver patterned interface 235 (e.g., such that the traces of multilayer circuit board patterned interface 230 may be aligned with the traces of sliver patterned interface 235). This may allow RF signals to be provided directly to each trace of sliver patterned interface 235 (e.g., via micro-bump array 240).

Figure 3C:
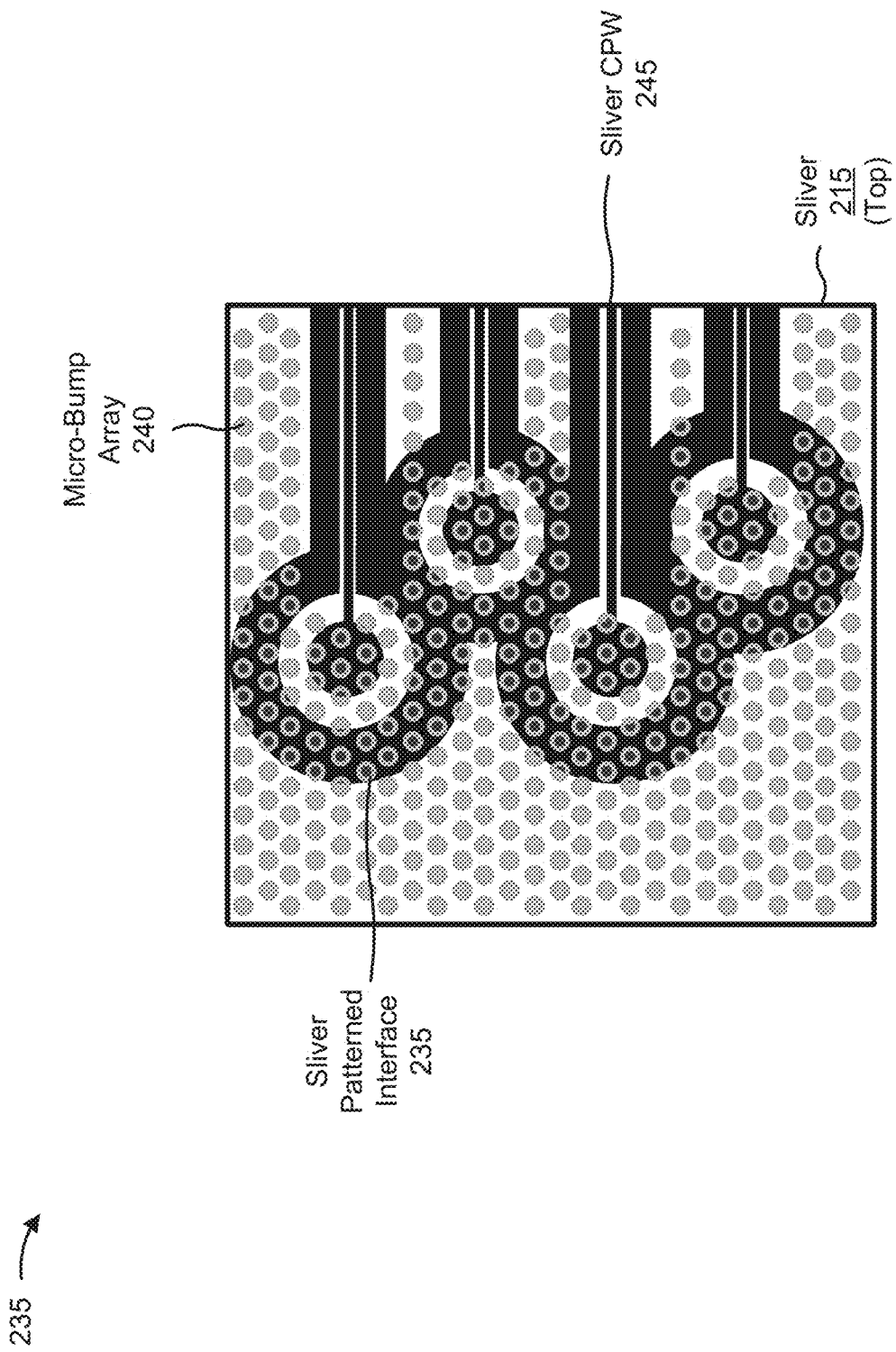
Figure 3D:
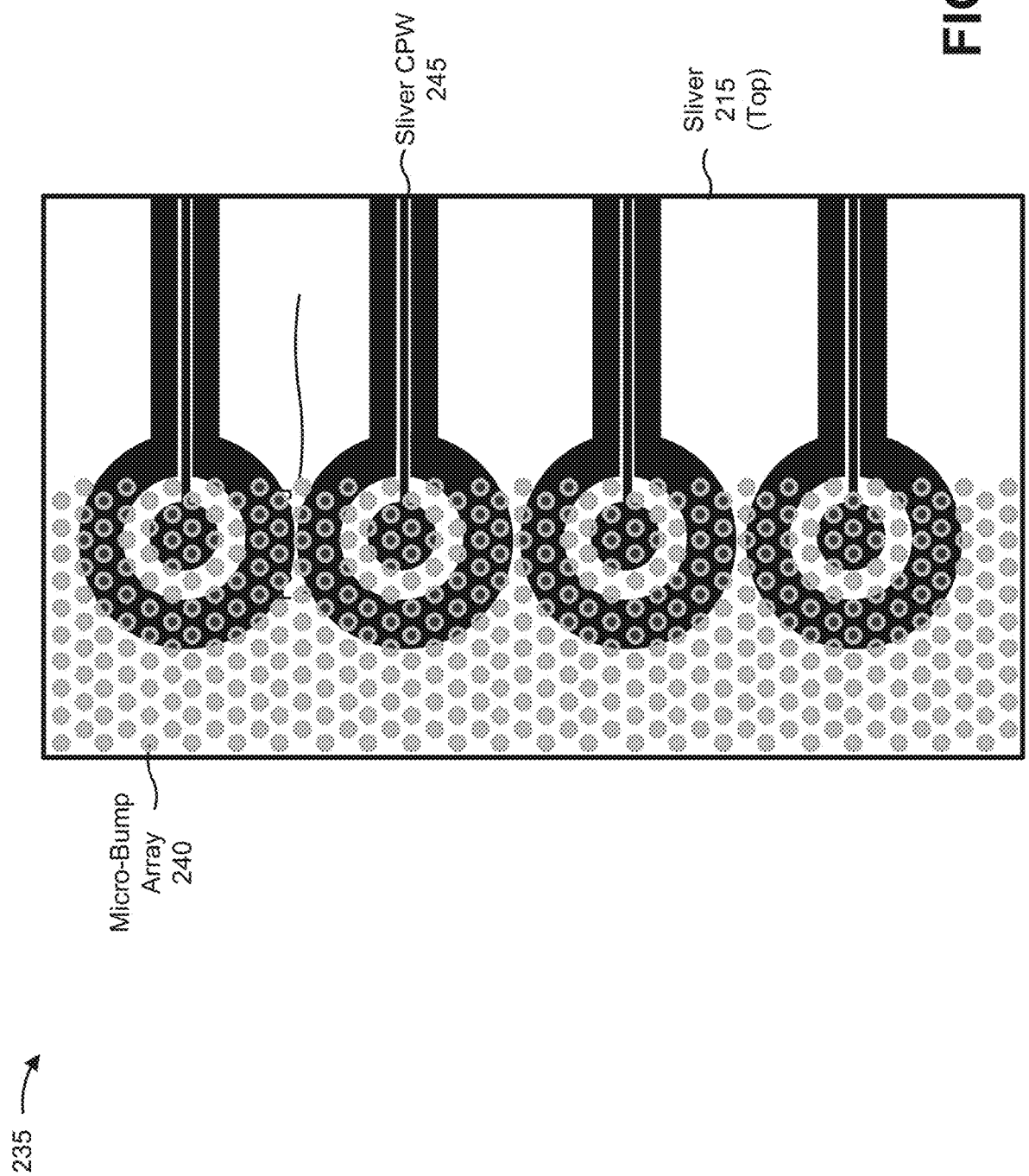

FIGS. 3C and 3D are additional examples of sliver patterned interfaces 235 including different arrangements of micro-bump array 240. As shown in FIG. 3C, sliver patterned interface 235 may include traces arranged as described above with regard to FIG. 3B. However, as shown, micro-bump array 240 may be arranged such that micro-bumps of micro-bump array 240 cover only traces of sliver patterned interface 235 (e.g., such that the micro-bumps do not cover traces of sliver CPWs 245). In other words, in some implementations, micro-bump array 240 may be a customized array or non-uniform array. In this example, micro-bump array 240 may be locally mounted on sliver patterned interface 235.

As shown in FIG. 3D, sliver patterned interface 235 may alternatively include traces arranged in a linear pattern (or another type of pattern). As shown, in some implementations, micro-bump array 240 may be arranged such that micro-bumps of micro-bump array 240 cover only traces of sliver patterned interface 235 (e.g., such that the micro-bumps do not cover traces of sliver CPWs 245). In this example, multilayer circuit board patterned interface 230 may be designed to match sliver patterned interface 235 (i.e., traces of multilayer circuit board patterned interface 230 may be arranged in a same linear pattern as those of sliver patterned interface 235 of FIG. 3D).

The number, arrangement, position, orientation, shape, pattern, and size of traces, micro-bumps, and sliver CPWs shown in FIGS. 3A-3D are provided as examples. In practice, multilayer circuit board patterned interface 230 and/or sliver patterned interface 235 may include additional traces, micro-bumps, and/or sliver CPWs, fewer traces, micro-bumps, and/or sliver CPWs, differently positioned traces, micro-bumps, and/or sliver CPWs, differently oriented traces, micro-bumps, and/or sliver CPWs, differently shaped traces, micro-bumps, and/or sliver CPWs, differently patterned traces, micro-bumps, and/or sliver CPWs, and/or differently sized traces, micro-bumps, and/or sliver CPWs, or differently arranged traces, micro-bumps, and/or sliver CPWs than those shown in FIGS. 3A-3D.

Figure 4A:
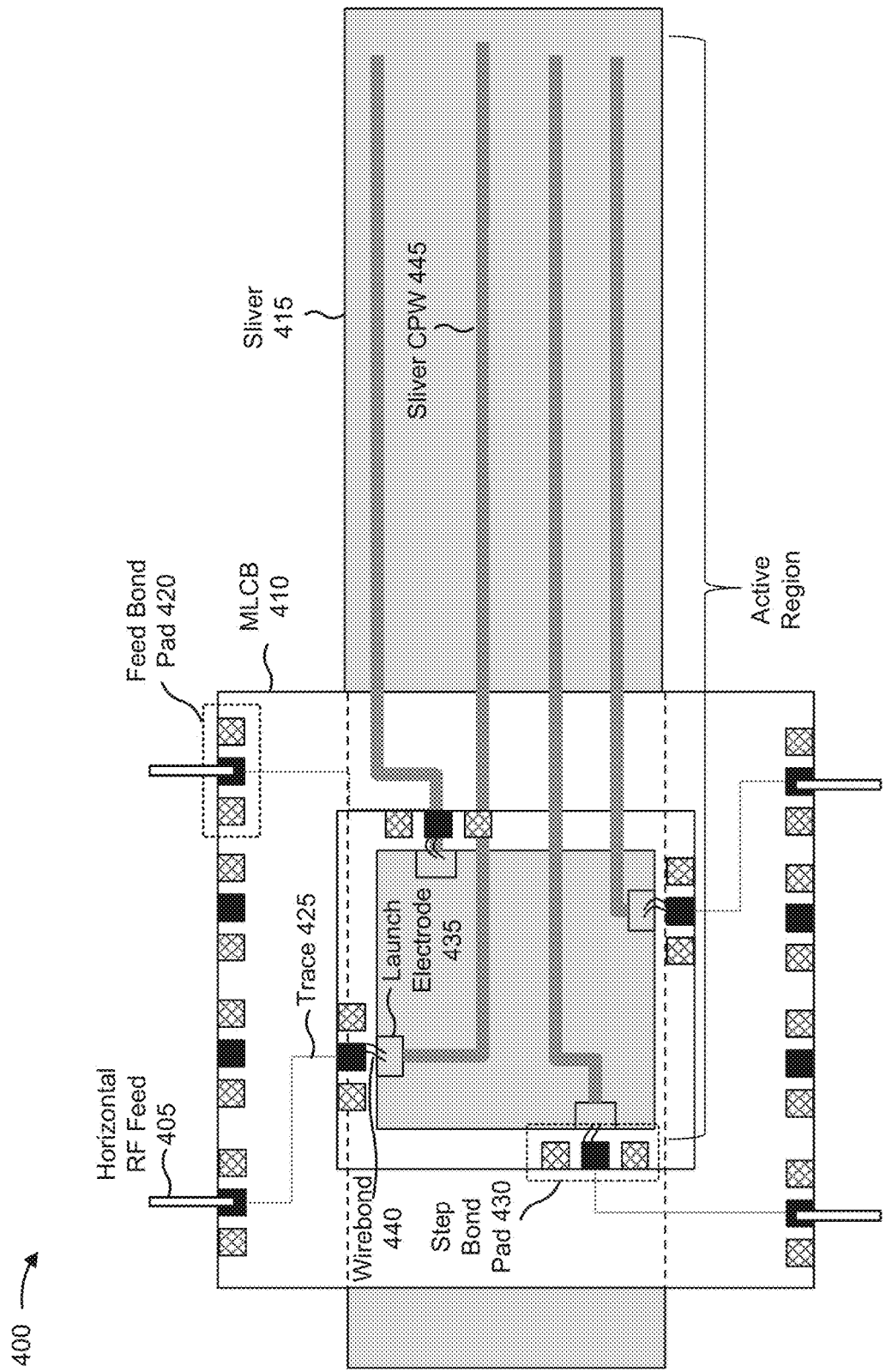
FIGS. 4A-4G are diagrams depicting example RF interconnects including multilayer circuit boards with various designs.

FIGS. 4A-4G are diagrams depicting example RF interconnects including multilayer circuit boards 210 with various designs. FIG. 4A is a diagram of an example RF interconnect 400 that includes multilayer circuit board 410 with a cavity. As shown in FIG. 4A, RF interconnect 400 may include a set of horizontal RF feeds 405, multilayer circuit board 410, and sliver 415. Horizontal RF feed 405, multilayer circuit board 410, and sliver 415 may correspond to RF signal feed 105, interposer 110, and sliver 115, respectively, as described above with respect to FIG. 1.

As shown in FIG. 4A, in some implementations, multilayer circuit board 410 may include a cavity (i.e., an opening) near a center of multilayer circuit board 410. The cavity may allow RF signals to be provided directly to an active region of sliver 415 after RF routing within multilayer circuit board 410, as described below. In some implementations, a first portion of a top surface of multilayer circuit board 410 may have a first height, and a second portion of the top surface of multilayer circuit board 410 may have a second height (e.g., such that the first portion is higher or lower than the second portion). In other words, multilayer circuit board 410 may include a stepped surface. For the purposes of FIG. 4A, a first portion of multilayer circuit board 410 (e.g., a portion of multilayer circuit board 410 immediately surrounding the cavity, as shown by the inner white square of FIG. 4A) may have a height that is less than a second portion of the multilayer circuit board 410 (e.g., a portion of multilayer circuit board 410 surrounding the first portion, as shown by the outer white square of FIG. 4A). In other words, RF interconnect 400 may include multilayer circuit board 410 with a step that surrounds the cavity in multilayer circuit board 410.

As shown in FIG. 4A, the set of horizontal RF feeds 405 may include one or more coaxial interconnects positioned at one or more sides of multilayer circuit board 410. As shown, the set of horizontal RF feeds 405 may be positioned such that directions in which RF signals, provided via horizontal RF feeds 405, are substantially parallel to a plane corresponding to a top and/or a bottom surface of multilayer circuit board 410 and/or sliver 415.

In some implementations, RF interconnect 400 may include one or more horizontal RF feeds 405. For example, RF interconnect 400 may include one horizontal RF feed 405, two horizontal RF feeds 405, four horizontal RF feeds 405 (e.g., as shown in FIG. 4A), eight horizontal RF feeds 405, sixteen horizontal RF feeds 405, or the like. Additionally, or alternatively, horizontal RF feeds 405 of RF interconnect 400 may be positioned at one or more sides of multilayer circuit board 410. For example, RF interconnect 400 may include a first set of horizontal RF feeds 405 at a first side of multilayer circuit board 410 and a second set of horizontal RF feeds 405 at a second side of multilayer circuit board 410. As another example, all horizontal RF feeds 405 may be positioned at a single side of multilayer circuit board 410. In some implementations, the configuration and/or arrangement of other components of multilayer circuit board 410 (e.g., feed bond pads 420, traces 425, step bond pads 430) may vary in order to match the number and/or arrangement of horizontal RF feeds 405. Multilayer circuit board 410 may comprise a material similar to that described above with regard to multilayer circuit board 210.

As shown, horizontal RF feeds 405 may be positioned on (i.e., may contact) feed bond pads 420 on a top surface of multilayer circuit board 410. Feed bond pad 420 may correspond to surface trace 120 described above with respect to FIG. 1. In some implementations, RF signals may be provided to signal portions of feed bond pads 420 (e.g., dark squares as shown in FIG. 4A) via corresponding horizontal RF feeds 405. Notably, for purposes of clarity, only connections and routing associated with the signal portions of feed bond pads 420 are shown in FIG. 4A.

As further shown, traces 425, included in multilayer circuit board 410, may connect to feed bond pads 420 for routing the RF signals through multilayer circuit board 410. Trace 425 may correspond to trace 125 described above with respect to FIG. 1. For example, trace 425 may include a stripline and/or a microstrip. As shown, traces 425 may connect feed bond pads 420 to step bond pads 430 (e.g., located on the step of multilayer circuit board 410, as described below) in order to allow the RF signals to be routed from feed bond pads 420 to corresponding step bond pads 430. Performing routing of the RF signals within multilayer circuit board 410 may reduce RF loss (e.g., as compared to routing the RF signals on sliver 415).

Step bond pad 430 may correspond to interposer interface 130 described above with respect to FIG. 1. In some implementations, the RF signals may be provided from multilayer circuit board 410 to sliver 415 via step bond pads 430. For example, as shown, the RF signals may be provided from step bond pads 430 via wirebonds 440 that connect step bond pads 430 to launch electrodes 435. Wirebonds 440 may correspond to conductive component 140 as described above with regard to FIG. 1. In some implementations, wirebonds 440 may be capable of accommodating variations in a horizontal position and/or a vertical position of sliver 415 with respect to multilayer circuit board 410. For example, thermal expansion and/or contraction of components (e.g., during assembly, during storage, during operation) may change a position of multilayer circuit board 410 relative to sliver 415. Here, wirebonds 440 may be capable of moving or shifting to accommodate such a position change, thereby improving reliability of the RF interconnect. For purposes of clarity, only wirebonds 440 associated with the signal portions of step bond pads 430 are shown in FIG. 4A.

Launch electrodes 435 may correspond to sliver interface 135 as described above with regard to FIG. 1. In some implementations, launch electrodes 435 may include a set of RF electrodes on a surface of sliver 415 via which the RF signals be provided to sliver CPWs 445 in an active region of sliver 415. For example, in some implementations, launch electrodes 435 may include a set of RF electrodes positioned on a surface of sliver 415, where each RF electrode may include a signal portion (e.g., a rectangular portion on the top surface of sliver 415 in FIG. 4A) and a corresponding ground portion (for purposes of clarity, only signal portions of launch electrodes 435 are shown in FIG. 4A).

As further shown in FIG. 4A, launch electrodes 435 may be positioned at the start of or within an active region of sliver 415. As further shown, launch electrodes 435 may connect to a corresponding sliver CPW 445. Sliver CPW 445 may correspond to sliver CPW 145 described above with respect to FIG. 1. Notably, with respect to RF interconnect 400, the RF signals are provided directly to launch electrodes 435 at the start of within the active region of sliver 415, thereby eliminating a need for RF routing on sliver 415 in order to reach the active region.

As such, RF interconnect 400 may use multilayer circuit board 410 to eliminate or reduce a need for RF routing to reach the active region. Similarly, RF interconnect 400 may eliminate and/or reduce a need for CPW bends on sliver 415 that are needed in a planar CPW configuration of the typical RF interconnect (i.e., the typical RF interconnect that includes planar RF routing on the sliver). This may allow for reduced RF loss and/or increased modulator bandwidth (as compared to the typical RF interconnect). Moreover, a signal path length (e.g., from horizontal RF feed 405 to sliver CPW 445), associated with RF interconnect 400, may be reduced due the use of multilayer circuit board 410, thereby allowing for further reduced RF loss and/or increased modulator bandwidth.

Figure 4B:
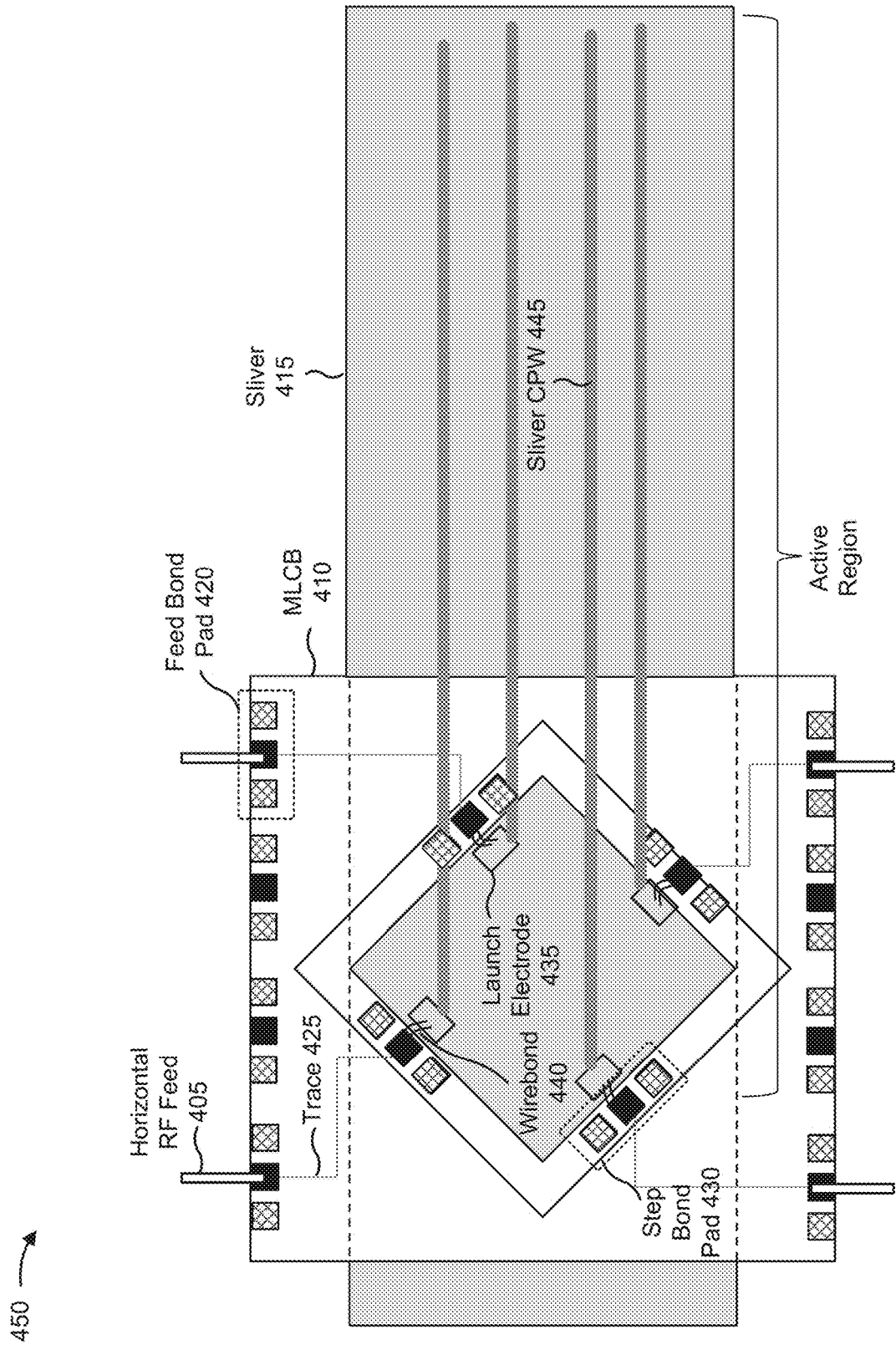

As shown in FIG. 4A, in some implementations, the cavity of multilayer circuit board 410 may be oriented such that one or more sides are orthogonal to sides of multilayer circuit board 410 and/or sliver 415. (e.g., in the case of the rectangular cavity shown in FIG. 4A). Alternatively, the cavity of multilayer circuit board 410 may be oriented at another angle with respect to sides of multilayer circuit board 410 and/or sliver 415. FIG. 4B is a diagram of an example RF interconnect 450 that includes multilayer circuit board 410 with a cavity including sides oriented at 45 degree angles with respect to sides of multilayer circuit board 410 and sliver 415. Notably, while the cavities shown in FIGS. 4A and 4B are shown as rectangular shapes, in some implementations, a cavity of multilayer circuit board 410 may be a different shape, such as a circular shape, a round shape, a triangular shape, a polygonal shape, or the like.

Figure 4C:
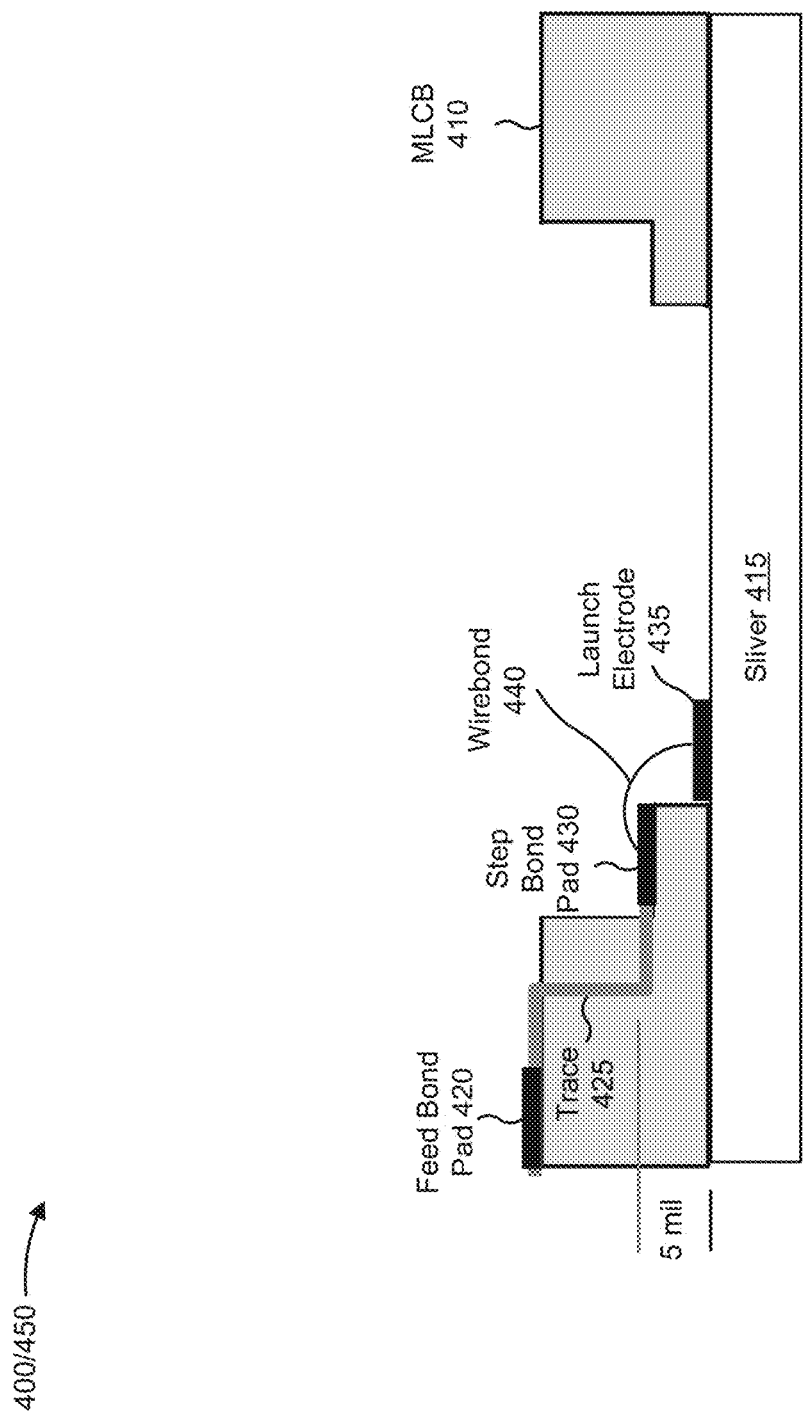

FIG. 4C is a diagram of an example cross section of RF interconnect 400 or RF interconnect 450 including multilayer circuit board 410 with an open cavity. As shown in FIG. 4C, feed bond pad 420 of multilayer circuit board 410 may be positioned on an upper top surface of multilayer circuit board 410, and may contact horizontal RF feed 405 (not shown), as described herein. As further shown, trace 425 of multilayer circuit board 410 may connect feed bond pad 420 to a corresponding step bond pad 430 at a lower top surface (i.e., step) of multilayer circuit board 410. As shown, trace 425 may be arranged to provide RF routing in a horizontal direction and/or a vertical direction within multilayer circuit board 410. As further shown, wirebond 440 may connect step bond pad 430 to launch electrode 435 on a top surface of sliver and within the active region of sliver 415.

Notably, a difference in height between step bond pad 430 and launch electrode 435 is less than a difference in height between feed bond pad 420 and launch electrode 435. As such, use of the stepped multilayer circuit board 410 reduces a difference in height between associated with wirebond 440. This smaller step may result in a smaller RF mismatch than a wirebond from feed bond pad 420 to launch electrode 435 would otherwise cause (e.g., from the upper surface of multilayer circuit board 410 to launch electrode 435). Similarly, a length of wirebond 440 may be reduced, thereby allow for a reduction in RF loss (e.g., approximately 0.1 dB). The reduced height difference and/or the reduced wirebond length may thus act to increase an operational bandwidth of the optical modulator.

In some implementations, a thickness of launch electrode 435 may act to further reduce the difference in height between step bond pad 430 and launch electrode 435. For example, launch electrodes 435 may be manufactured with a thickness of approximately 3 mils (approximately 75 microns). As shown, if the step of multilayer circuit board 410 has a thickness of approximately 5 mils, the height difference would thereby be reduced to approximately 2 mils.

Figure 4D:
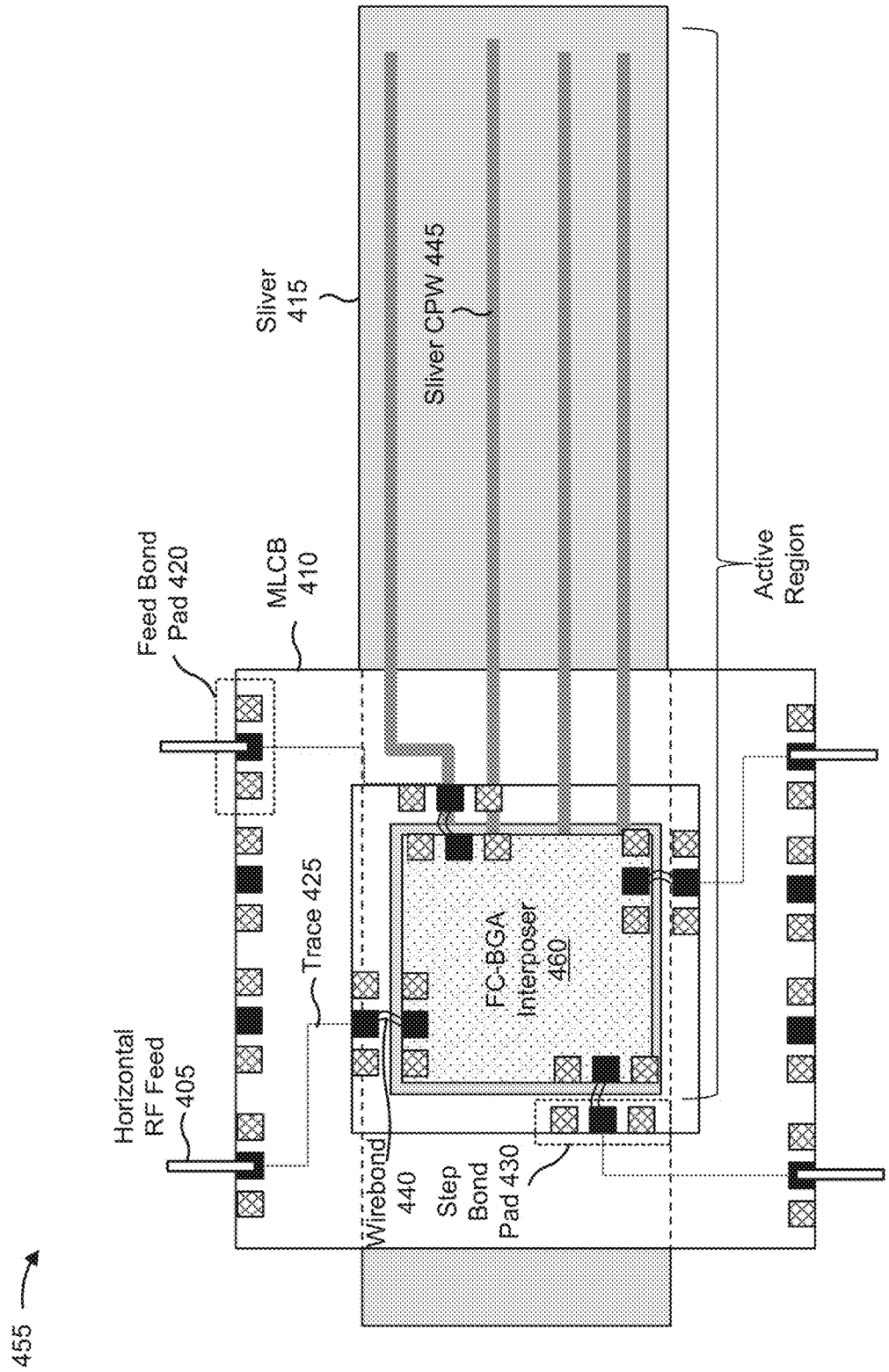

In some implementations, an interposer may be positioned in the cavity of multilayer circuit board 410. FIG. 4D is a diagram of an example RF interconnect 455 including multilayer circuit board 410 with a cavity and an interposer in the form of flip-chip ball grid array (FC-BGA) 460. As shown in FIG. 4D, FC-BGA 460 may be positioned in the cavity of multilayer circuit board 410 (e.g., ball side down). FC-BGA 460 may include a set of bond pads on a top surface of FC-BGA 460, and a ball grid array on a bottom surface of FC-BGA 460 (not shown). As further shown, wirebonds 440 may connect step bond pads 430 to corresponding FC-BGA 460 bond pads. Here, RF signals may be routed, within FC-BGA 460, from the FC-BGA 460 bond pads to launch electrodes 435 (e.g., via routing traces within FC-BGA and balls of FC-BGA 460). In some implementations, the presence of FC-BGA 460 further reduces the height spanned by, and RF loss from, wirebonds 440. In some implementations, integration with a component (e.g., an active component, a passive component) of FC-BGA 460 may be used for monitoring and/or feedback control associated with RF interconnect 455.

Figure 4E:
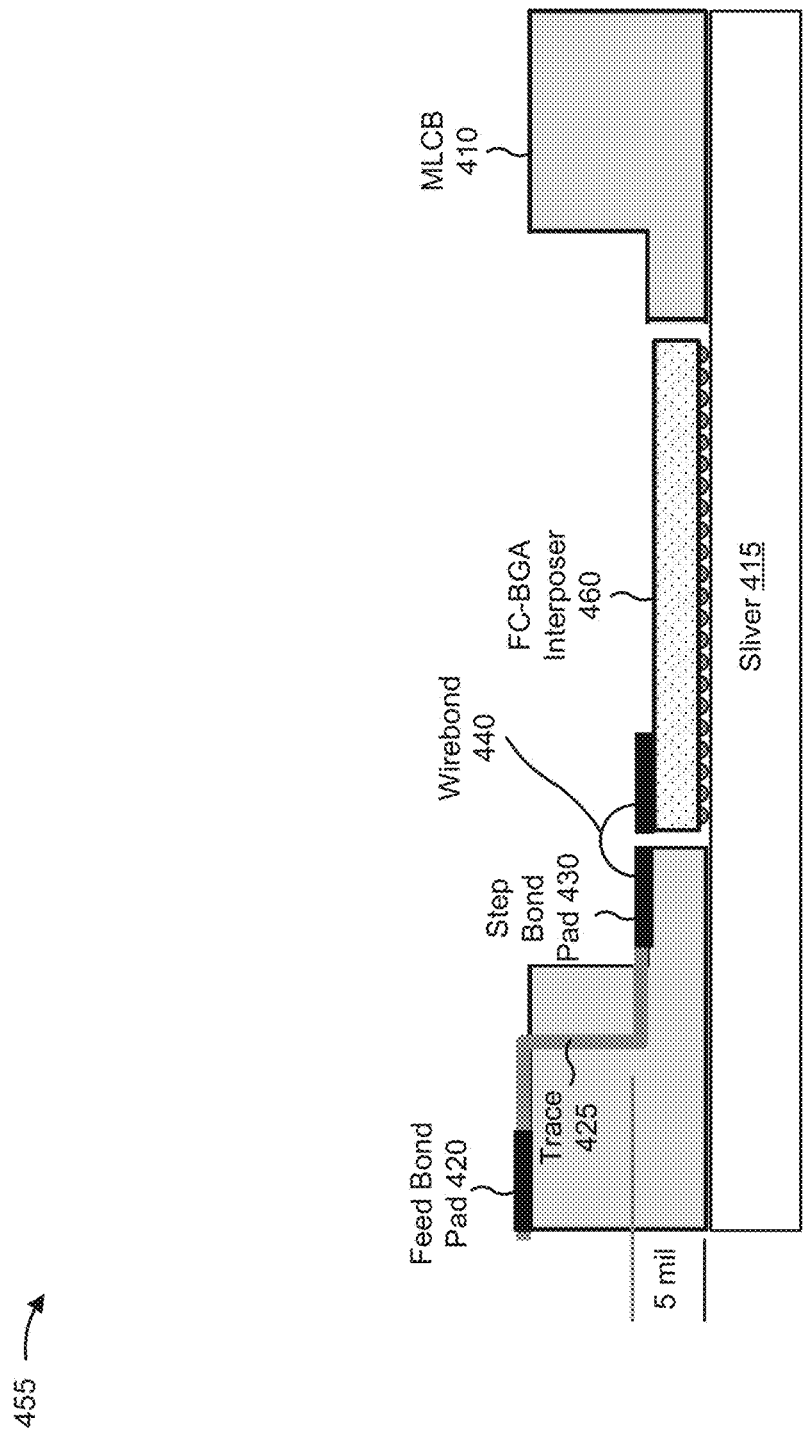

FIG. 4E is a diagram of an example cross section of RF interconnect 455 including multilayer circuit board 410 with a cavity and FC-BGA 460. As shown in FIG. 4E, a height of step bond pad 430 may be similar to a height of FC-BGA 460 (e.g., such that ends of wirebond 440 are at a substantially same height). In some implementations, causing ends of wirebonds 440 to be at approximately a same height reduced stress on wirebonds 440, thereby improving RF signal matching and/or connection reliability. Notably, while a height of the step of multilayer circuit board 410 is shown as 5 mils FIG. 4E (e.g., in order to match a height of FC-BGA 460), in some implementations, the height of the step of multilayer circuit board may be another height. In some implementations, the height of the step of multilayer circuit board 410 may be less than approximately 10 mil in order to achieve acceptable impedance matching. Notably, while RF interconnect 455 is described in the context of an interposer in the form of FC-BGA 460, in some implementations, another type of interposer may be positioned in the cavity of multilayer circuit board 410.

Figure 4F:
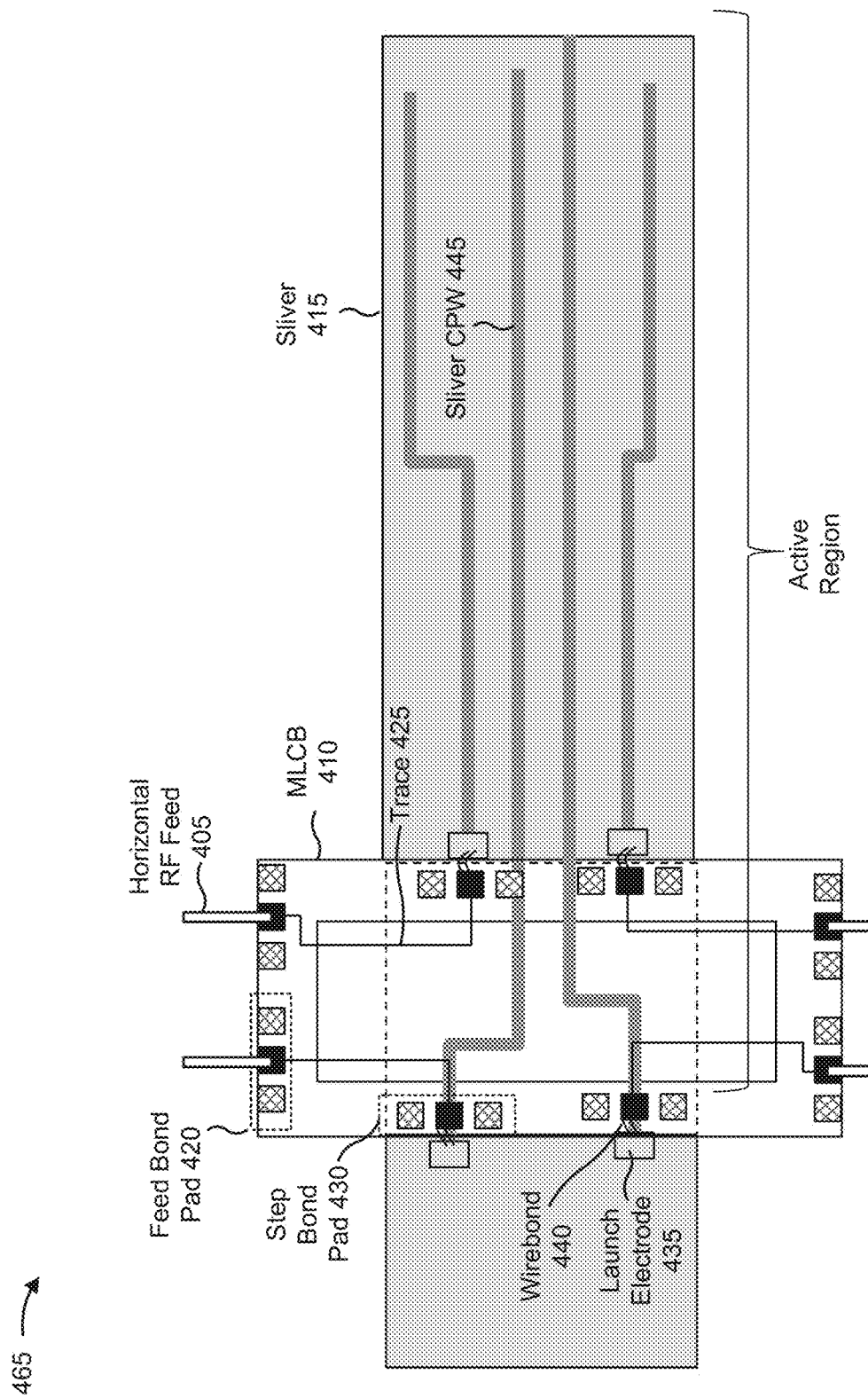

In some implementations, multilayer circuit board 410 may include a stepped surface and no cavity. FIG. 4F is a diagram of an example RF interconnect 465 including multilayer circuit board 410 with a center step and no cavity. For the purposes of FIG. 4F, a first portion of multilayer circuit board 410 (e.g., a portion of multilayer circuit board 410 nearer to and including a center of multilayer circuit board 410, as shown by the inner white rectangle of FIG. 4F) may have a height that is greater than a second portion of the multilayer circuit board 410 (e.g., a portion of multilayer circuit board 410 near edges of multilayer circuit board 410, as shown by the outer white rectangle of FIG. 4F). In other words, RF interconnect 465 may include multilayer circuit board 410 with a center step.

Here, traces 425 may route (e.g., in a horizontal direction, in a vertical direction) the RF signals from feed bond pads 420 to step bond pads 430 within multilayer circuit board 410. In some implementations, trace 425 may first route an RF signal in an upward direction (i.e., away from the top surface of sliver 415) within the center step, and then in a downward direction (i.e., toward the top surface of 415) within center step as trace 425 approaches step bond pad 430. Designing trace 425 to keep the RF signal away from the top surface of sliver 415 may ensure that the RF signal is isolated from the top surface of sliver 415.

Figure 4G:
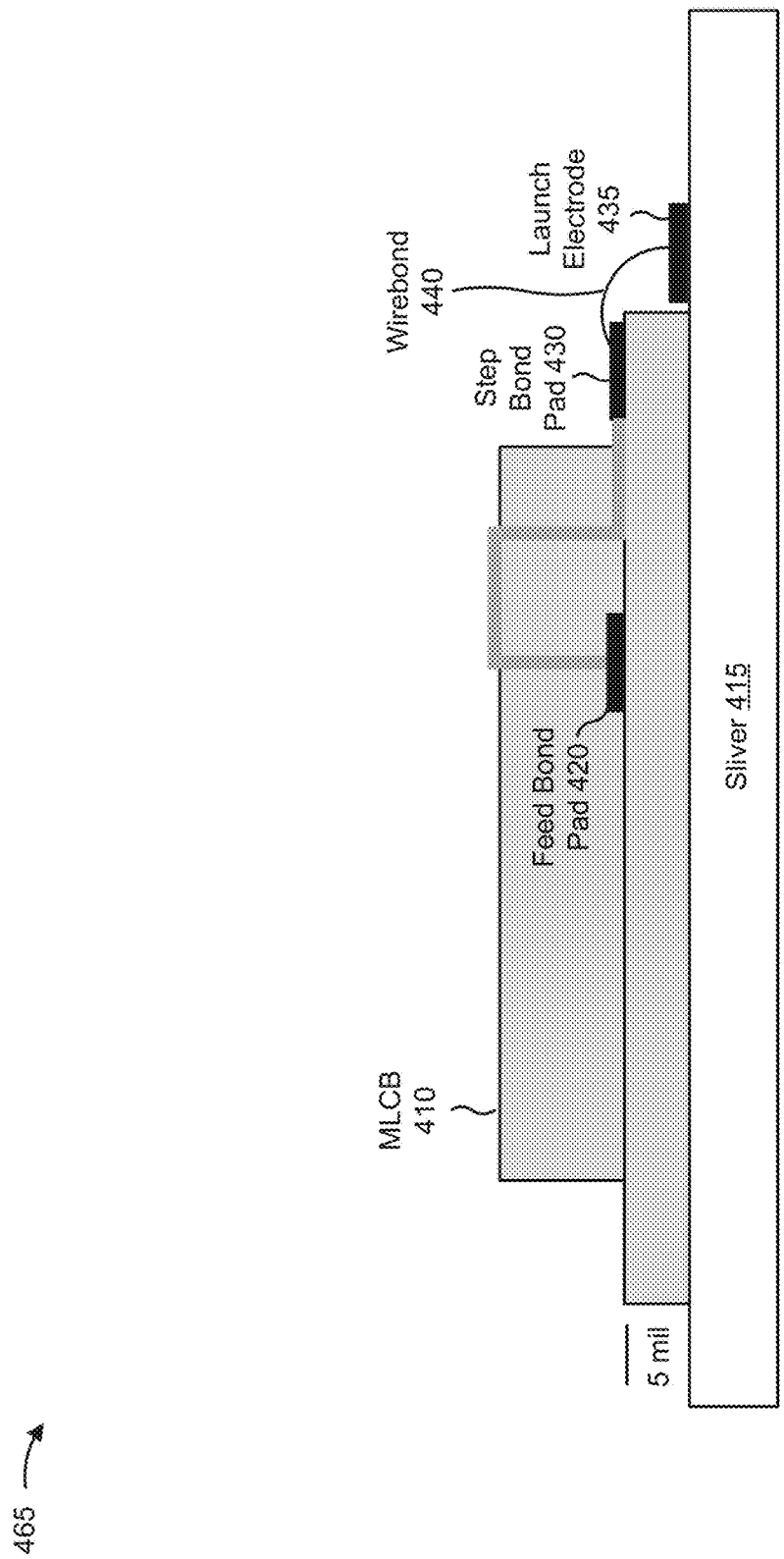

FIG. 4G is a diagram of an example cross section of RF interconnect 465 including multilayer circuit board 410 with a center step and no cavity. As shown in FIG. 4F, feed bond pad 420 of multilayer circuit board 410 may be positioned on a lower surface of multilayer circuit board 410 (e.g., at an outer edge of multilayer circuit board 410), and may contact horizontal RF feed 405 (not shown), as described herein. As further shown, trace 425 of multilayer circuit board 410 may connect feed bond pad 420 to a corresponding step bond pad 430 on the lower surface of multilayer circuit board 410. However, as shown, trace 425 may route the RF signal in an upward direction when trace 425 enters the center step, and then in a downward direction as trace 425 approaches step bond pad 430. In some implementations, trace 425 may be designed to route the RF signal in an upward direction in order to avoid RF coupling between trace 425 and traces of sliver CPWs 445 on sliver 415 that may otherwise occur (e.g., due to a comparatively thin layer of multilayer circuit board 410 positioned over or proximate to the active region of sliver 415). In this way, trace 425 may be arranged to provide RF routing in a horizontal direction and/or a vertical direction within multilayer circuit board 410 with the center step. As further shown, wirebond 440 may connect step bond pad 430 to launch electrode 435 on a top surface of sliver and within the active region of sliver 415.

In some implementations, RF interconnect 465 may include one or more vertical RF feeds directly to a top surface of the center step of multilayer circuit board 410 of RF interconnect 465 (e.g., rather than or in addition to horizontal RF feeds 405 associated with FIGS. 4F and 4G).

The number, arrangement, position, orientation, size, or the like, of features and components of RF interconnects 400, 450, 455, and 465 shown in FIGS. 4A-4G are provided as examples. In practice, RF interconnects 400, 450, 455, and 465 may include additional features and/or components, fewer features and/or components, different features and/or components, or differently arranged features and/or components, differently positioned features and/or components, differently oriented features and/or components, or differently sized features and/or components than those shown in FIGS. 4A-4G.

For example, while RF interconnects 400, 450, 455, and 465 are shown as including conductive components 140 in the form of wirebonds 440, in some implementations, RF interconnects 400, 450, 455, and 465 may include another type of conductive component 140, such as a ribbon bond, a micro-bump array that provides a connection between a bottom surface of multilayer circuit board 410 and launch electrodes 435. In this example, step bond pads 430 may be positioned on the bottom surface of multilayer circuit board 410 such that the micro-bump array may provide a connection between launch electrodes 435 and step bond pads 430 (i.e., such that the micro-bump array is between launch electrodes 435 and step bond pads 430). As another example, while RF interconnects 400, 450, 455, and 465 are shown as including a set of horizontal RF feeds 405, in some implementations, RF interconnects 400, 450, 455, and/or 465 may be configured to include one or more vertical feeds (e.g., (e.g., in addition to horizontal feeds 405, rather than horizontal feeds 405).

Additionally, or alternatively, a set of features or a set of components (e.g., one or more features or one or more components) of RF interconnects 400, 450, 455, and 465 may perform one or more functions described as being performed by another set of features and/or components of RF interconnects 400, 450, 455, and 465.

Figure 5A:
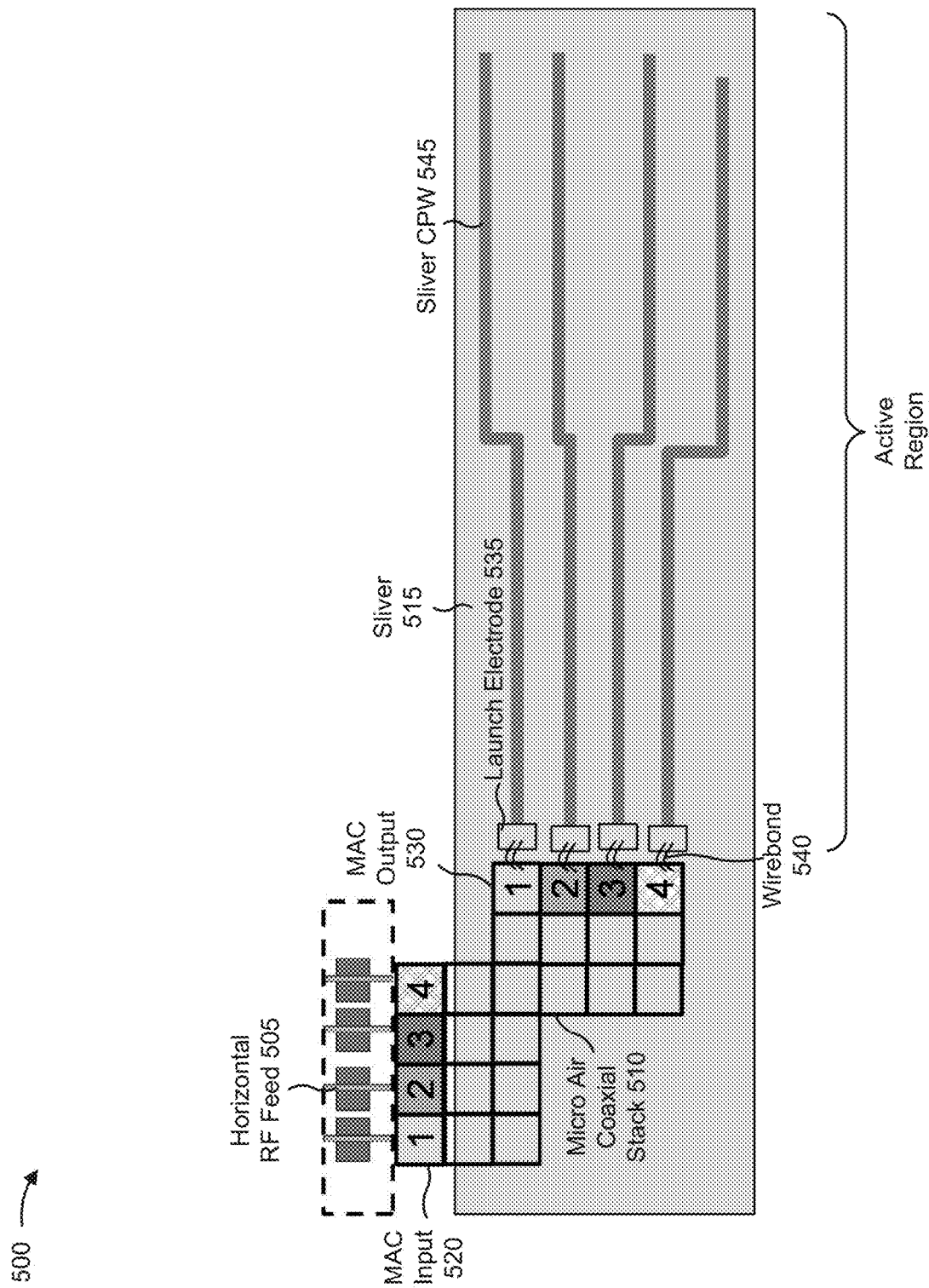

FIGS. 5A-5E are diagrams depicting example RF interconnect 500 including a micro-air coaxial stack associated with routing an RF signal. As shown in FIG. 5A, RF interconnect 500 may include a set of horizontal RF feeds 505, micro-air coaxial stack 510, and sliver 515. Horizontal RF feed 505, micro-air coaxial stack 510, and sliver 515 may correspond to RF signal feed 105, interposer 110, and sliver 115, respectively, as described above with respect to FIG. 1.

As shown in FIG. 5A, the set of horizontal RF feeds 505 may include one or more coaxial interconnects positioned at a side of micro-air coaxial stack 510. As shown, the set of horizontal RF feeds 505 may be positioned such that directions in which RF signals, provided via horizontal RF feeds 505, are substantially parallel to a plane corresponding to a top and/or a bottom surface of sliver 515.

In some implementations, the set of horizontal RF feeds 505 may connect to a set of input channels of micro-air coaxial stack 510 (herein referred to as MAC inputs 520). MAC input 520 may correspond to surface trace 120 as described with regard to FIG. 1. In some implementations, micro-air coaxial stack 510 may include a three dimensional structure that includes traces capable of routing (e.g., in a horizontal direction, in a vertical direction) RF signals from MAC inputs 520 to a set of output channels of micro-air coaxial stack 510 (herein referred to as MAC outputs 530). MAC output 530 may correspond to interposer interface 130 as described with regard to FIG. 1. In some implementations, the traces of micro-air coaxial stack 510 may include a conductor or trace that is surrounded (within micro-air coaxial stack 510) by a dielectric material, such as an environment (e.g., air) of a package in which RF interconnect 500 is housed and then further surrounded by ground electrode structure. For example, a unit of a micro-air coaxial stack may be a cube having a ground electrode exterior and route a conductor from one face of the cube to another face of the cube. Regardless of which two faces of the cube are selected, the micro-air coaxial unit may have the same RF loss and may have the same conductor path length. Connecting multiple micro-air coaxial units together in a stack may create a three dimensional path for one or more conductors forming an array of one or more traces through the micro-air coaxial stack. Although identified as a micro-air coaxial stack, the dielectric between the conductor and the ground structure may be a dielectric material or substance other than air.

In some implementations, micro-air coaxial stack 510 may be mounted on top of sliver 515 and adjacent to active region of sliver 515. In some implementations, an interposer may be used at MAC inputs 520 of the micro-air coaxial stack 510. Here, compatibility of modal coupling and impedance matching for achieving a reduced return loss may be improved when the interposer has a compatible height relative to micro-air coaxial stack 510.

In some implementations, group delay of the RF signals routed via micro-air coaxial stack 510 may be aligned at MAC outputs 530 by matching electrical lengths within micro-air coaxial stack 510. In some implementations, matching electrical lengths within micro-air coaxial stack 510 may have the advantage of reducing or minimizing a circuit size within the stack footprint (e.g., as available space may be limited).

Figure 5B:
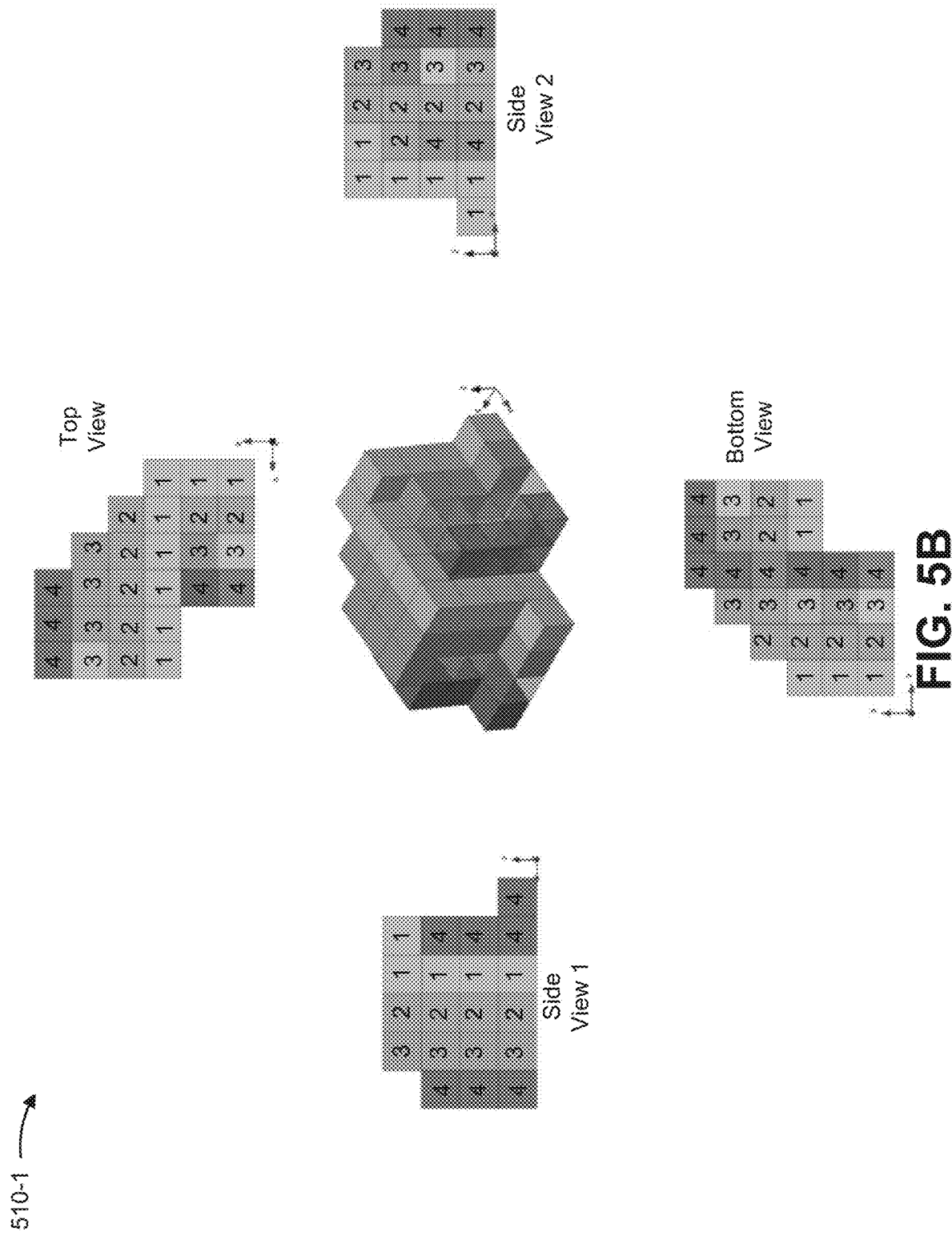

FIG. 5B includes diagrams depicting a three-dimensional view, a top view, a bottom view, and side views of a first example design for micro-air coaxial stack 510 (e.g., micro-air coaxial stack 510-1) with matching electrical lengths for routing of RF signals. As shown, micro-air coaxial stack 510-1 may include routing for four RF signals (e.g., 1, 2, 3, 4). Notably, each RF signal path is a same length within micro-air coaxial stack 510-1 (e.g., each RF signal path includes a same number of corresponding cubes in FIG. 5B).

Figure 5C:
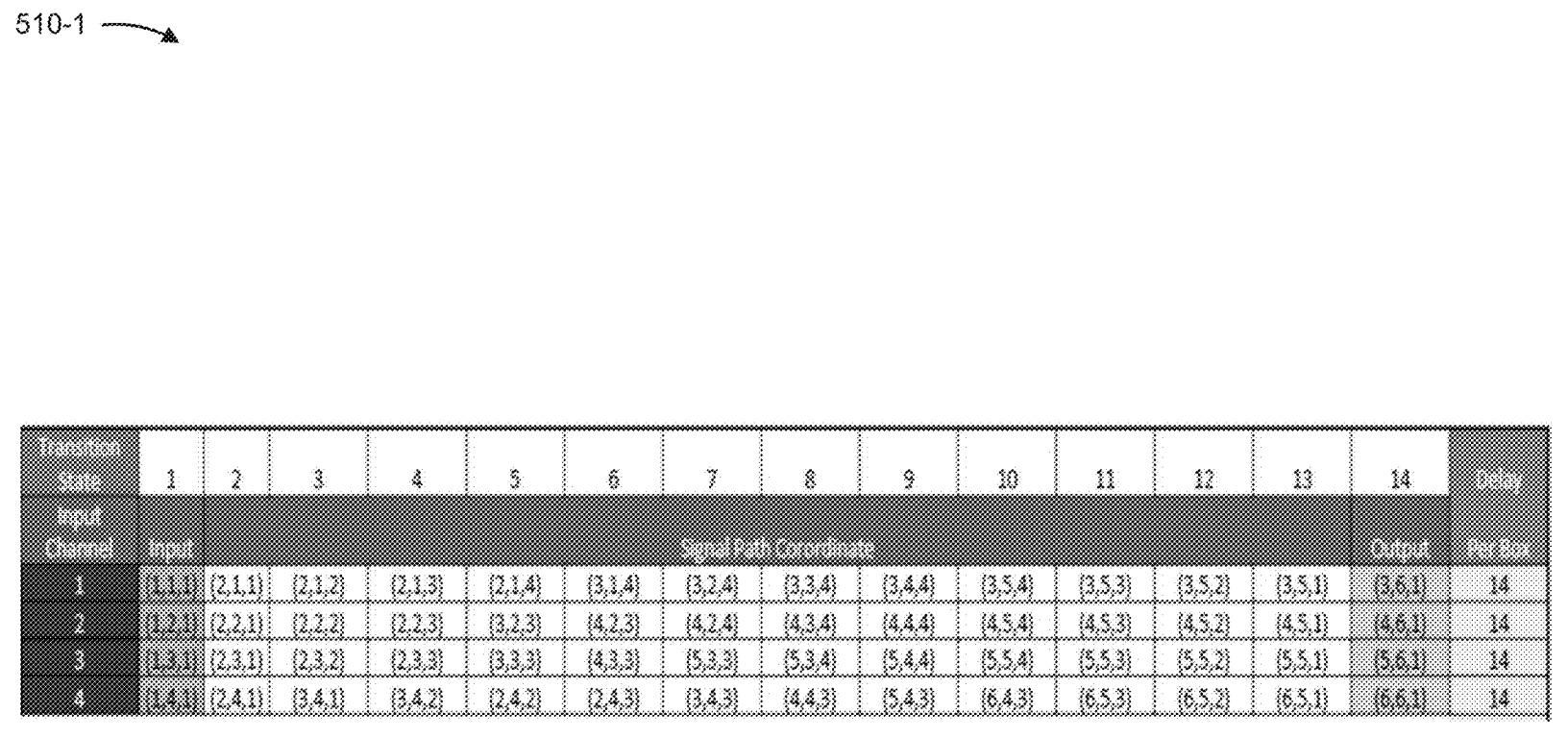

FIG. 5C is a table illustrating that electrical lengths of micro-air coaxial stack 510-1 are matched within micro-air coaxial stack 510-1. As shown in FIG. 5C, each of the four RF signal routes of micro-air coaxial stack 510-1 have a same path length (e.g., 14 length units, where each unit is represented by a square or cube in FIG. 5B) and, thus, a same delay (e.g., 14 delay units). FIG. 5C also includes signal path coordinates that identify a location of each portion of the RF signal paths. Notably, no two RF signal paths overlap at a same location within micro-air coaxial stack 510-1.

Figure 5D:
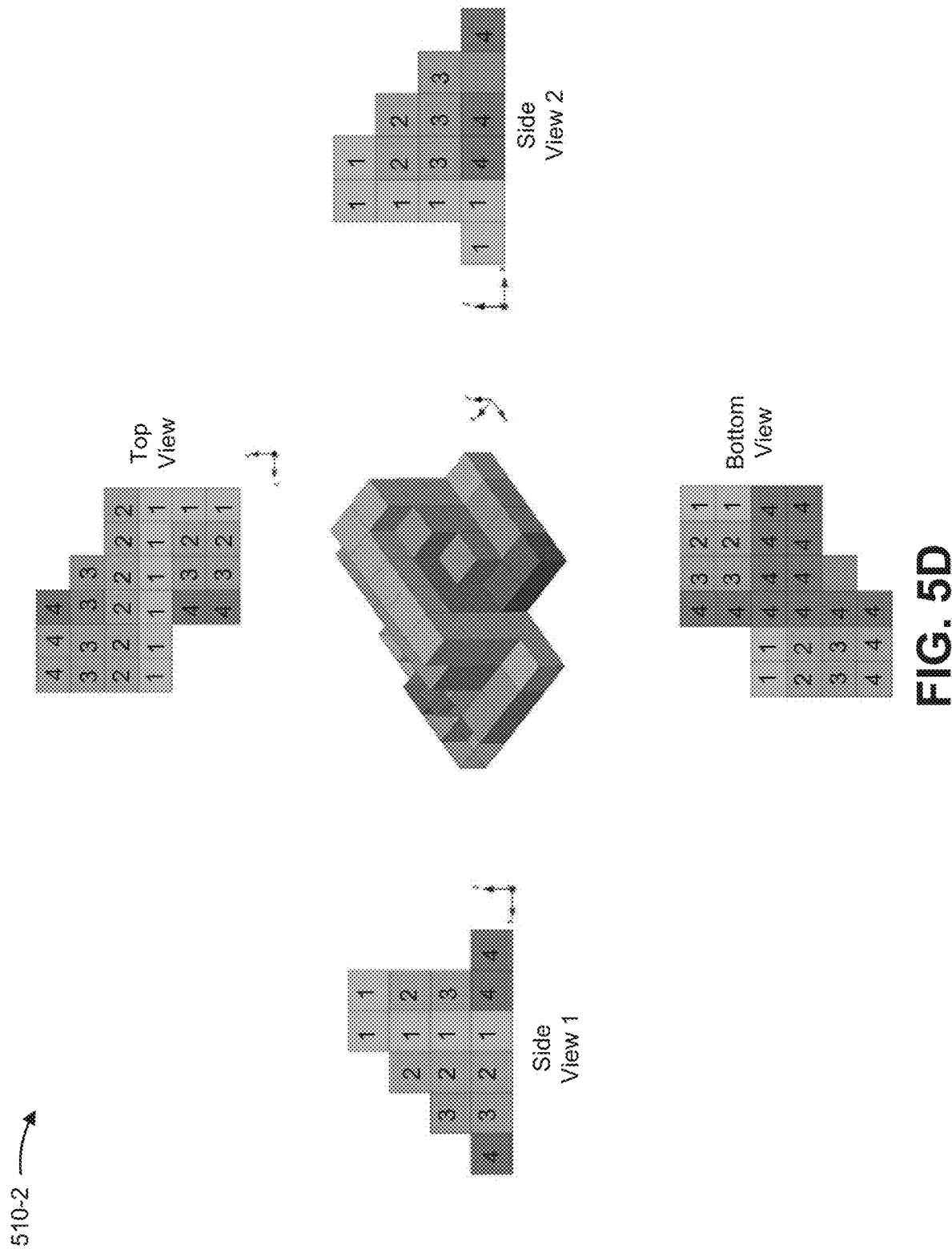

FIG. 5D includes diagrams depicting a three-dimensional view, a top view, a bottom view, and side views of a second example design for micro-air coaxial stack 510 (e.g., micro-air coaxial stack 510-2) with matching electrical lengths for routing of RF signals. As shown, micro-air coaxial stack 510-2 may include routing for four RF signals (e.g., 1, 2, 3, 4). Notably, each RF signal path is a same length within micro-air coaxial stack 510-2 (e.g., each RF signal path includes a same number of corresponding cubes in FIG. 5D).

Figure 5E:
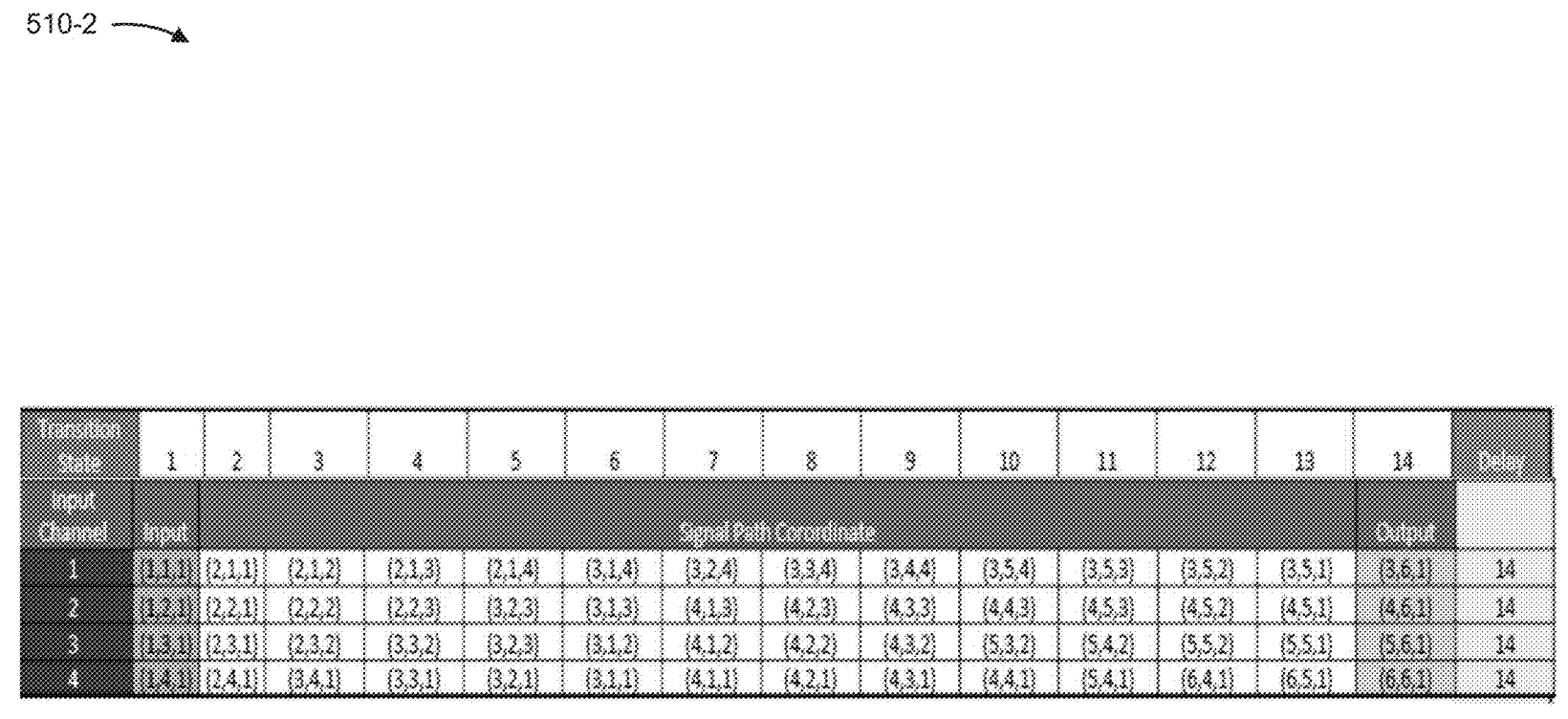

FIG. 5E is a table illustrating that electrical lengths of micro-air coaxial stack 510-2 are matched within micro-air coaxial stack 510-2. As shown in FIG. 5E, each of the four RF signal routes of micro-air coaxial stack 510-2 have a same path length (e.g., 14 length units, where each unit is represented by a square or cube in FIG. 5D) and, thus, a same delay (e.g., 14 delay units). FIG. 5E also includes signal path coordinates that identify a location of each portion of the RF signal paths. Notably, no two RF signal paths overlap at a same location within micro-air coaxial stack 510-2.

Returning to FIG. 5A, in some implementations, micro-air coaxial stack 510 may form a coaxial impedance taper to provide impedance transformation (e.g., from a 50 Ohm impedance input to a lower impedance output). For example, impedance transformation may be provided by varying a size of a trace, associated with routing an RF signal, and maintaining a uniform cross-section coaxial size along the trace within micro-air coaxial stack 510 (e.g., from MAC input 520 to MAC output 530). As another example, impedance transformation may be provided by varying the cross-section coaxial size and maintaining a uniform trace size along the trace within micro-air coaxial stack 510. Additionally, or alternatively, micro-air coaxial stack 510 may have an impedance defined that better matches to an impedance of sliver CPW 545.

As further shown in FIG. 5A, MAC outputs 530 may connect to launch electrodes 535 via wirebonds 540. Launch electrodes 535 may correspond to sliver interface 135 as described above with regard to FIG. 1. In some implementations, launch electrodes 535 may include a set of RF electrodes on a surface of sliver 515 via which the RF signals be provided to sliver CPWs 545 in an active region of sliver 515. For example, in some implementations, launch electrodes 535 may include a set RF electrodes positioned on a surface of sliver 515, where each RF electrode may include a signal portion (e.g., a rectangular portion on the top surface of sliver 515 in FIG. 5A) and a corresponding ground portion (for purposes of clarity, only signal portions of launch electrodes 535 are shown in FIG. 5A). Wirebonds 540 may correspond to conductive component 140 as described above with regard to FIG. 1. For purposes of clarity, only wirebonds 540 associated with the signal portions of MAC outputs 530 are shown in FIG. 5A.

As further shown in FIG. 5A, launch electrodes 535 may be positioned at the start of or within an active region of sliver 515. As further shown, launch electrodes 535 may connect to a corresponding sliver CPW 545. Sliver CPW 545 may correspond to sliver CPW 145 described above with respect to FIG. 1. Notably, with respect to RF interconnect 500, the RF signals are provided directly to launch electrodes 535 at the start of within the active region of sliver 515, thereby eliminating a need for RF routing on sliver 515 in order to reach the active region.

In some implementations, RF interconnect 500 may allow for reduced RF loss and/or increased modulator bandwidth (as compared to the traditional RF interconnect) by providing for low loss routing within micro-air coaxial stack 510 and/or by reducing or eliminating a need for RF routing on sliver 515 in order to provide the RF signals to the active region. While MAC inputs 520 of FIG. 5A are shown as being positioned to a left side of MAC outputs 530, in some implementations, MAC inputs 520 may be positioned to a right side of MAC outputs 530 (e.g., when a direct transition between micro-air coaxial stack 510 and launch electrodes 535 exists, an orientation of micro-air coaxial stack 510 may be reversed from left to right). A similar approach may be applied to positioning of MAC outputs 530 (i.e., MAC outputs 530 may be differently oriented with respect to MAC inputs 520). As a result, micro-air coaxial stack 510 may be designed to reduce a size and/or a length of sliver 515, thereby reducing a cost of sliver 515, a package cost and/or size of the optical modulator, or the like.

Notably, while RF interconnect 500 is shown to include RF signal feeds 105 in the form of horizontal RF feeds 505, in some implementations, RF interconnect 500 may include another type of RF feed, such as a vertical RF feed that reaches micro-air coaxial stack 510 directly, via a multilayer circuit board, or the like. Here, MAC inputs 520 may be arranged parallel to MAC outputs 530. In a case where a multilayer circuit board is used in RF interconnect 500, the multilayer circuit board may connect to micro-air coaxial stack 510 via wirebonds, ribbon wires, or the like.

The number, arrangement, position, orientation, size, and the like, of features and components shown in FIGS. 5A-5E are provided as examples. In practice, RF interconnect 500 may include additional features and/or components, fewer features and/or components, different features and/or components, differently arranged features and/or components, differently positioned features and/or components, differently oriented features and/or components, or differently sized features and/or components than those shown in FIGS. 5A-5E. Additionally, or alternatively, a set of features and/or a set of components (e.g., one or more features and/or one or more components) of RF interconnect 500 may perform one or more functions described as being performed by another set of features and/or components of RF interconnect 500.

Figure 6A:
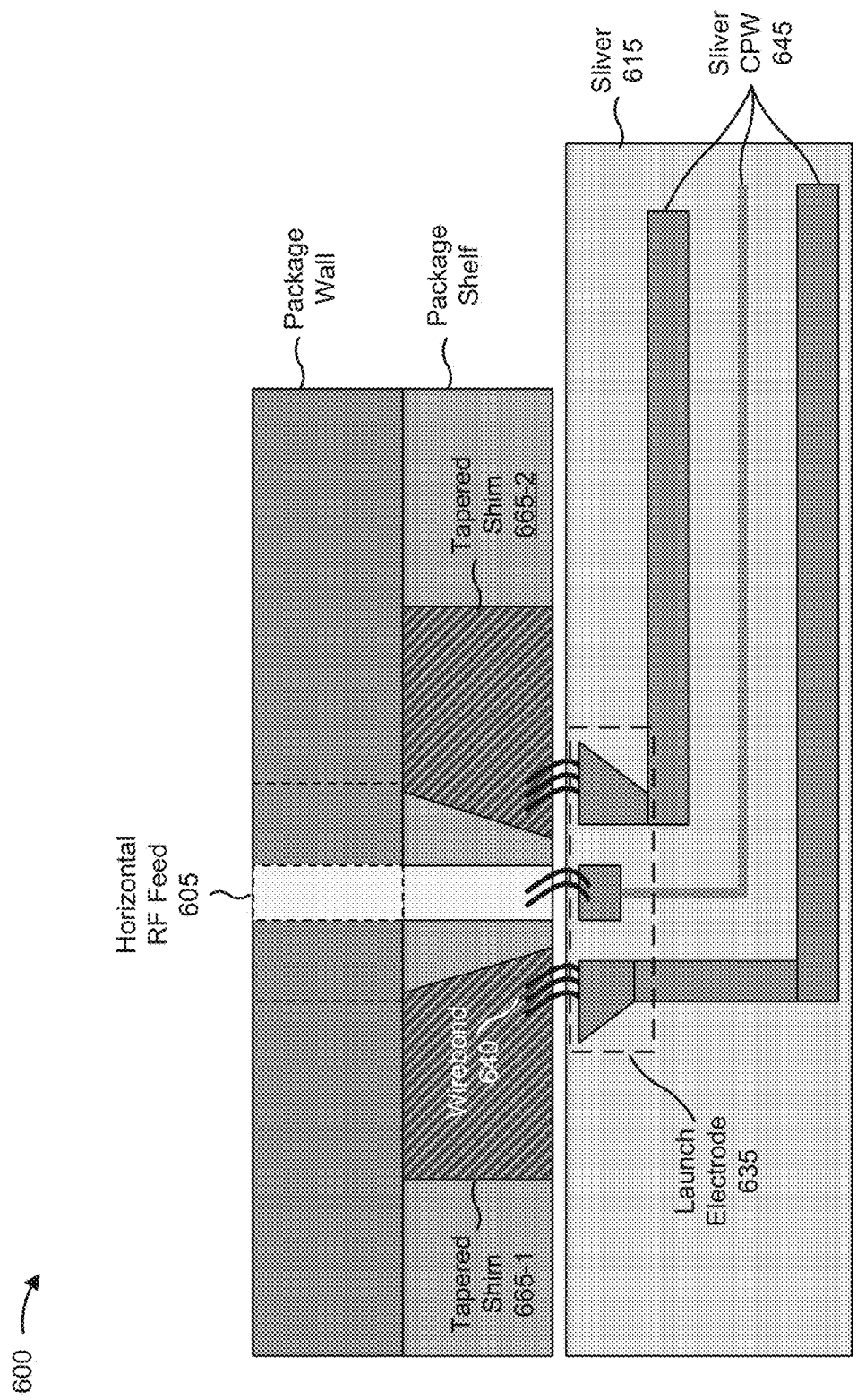
FIGS. 6A and 6B are diagrams depicting an example open coaxial RF interconnect including tapered shims.
Figure 6B:
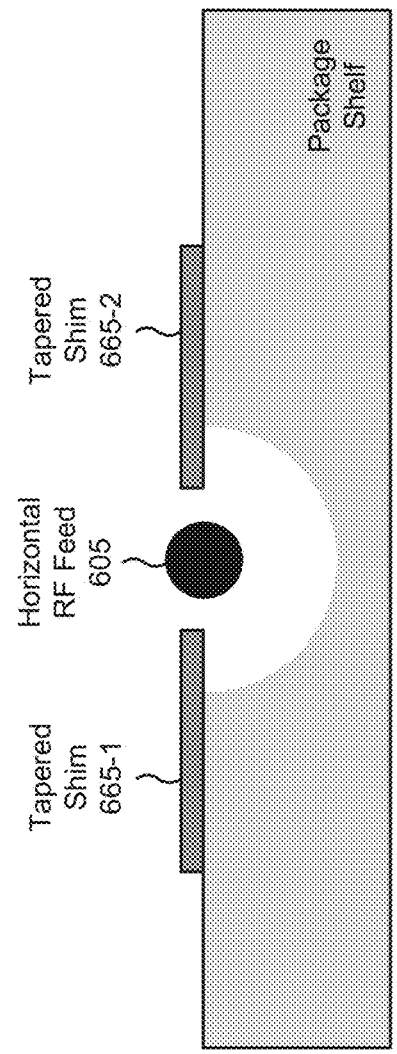

FIGS. 6A and 6B are diagrams depicting example open RF interconnect 600 including tapered shims. RF interconnect 600 may include an open RF interconnect with impedance matching shims that allows for low insertion loss and/or impedance transformation, thereby increasing bandwidth of an optical modulator. As shown in FIG. 6A, a set of metallic tapered shims 665 (e.g., tapered shim 665-1 and 665-2) may be mounted on a package shelf such that a portions of tapered shims 665 extend over an open space surrounding horizontal RF feed 605. FIG. 6B is a diagram of a cross section of RF interconnect 600 that illustrates the manner in which tapered shims 665 may be mounted over the open space surrounding horizontal RF feed 605.

Returning to FIG. 6A, as shown, tapered shims 665 may be angled to form a tapered section such that a distance between tapered shims 665 and horizontal RF feed 605 decreases from the package wall toward wirebond 640. In some implementations, tapered shims 665 may modify and/or transform an impedance of a characteristic impedance, along the length of horizontal RF feed 605, to an output impedance value that matches that of launch electrodes 635 on sliver 615 (e.g., in the active region of sliver 615).

In some implementations, tapered shims 665 of RF interconnect 600 may allow for adjustment and/or tuning of impedance of RF interconnect 600 in order to improve a power transfer and/or increase bandwidth of the optical modulator. As further shown in FIG. 6A, wirebond 640 may connect horizontal RF feed 605 to launch electrode 635 on sliver 615. Here, RF interconnect 600 may approximate a coplanar waveguide at wirebond 640 in order to better match a field profile of sliver CPW 645, thereby reducing parasitic capacitance or inductance from fringing fields.

The number, arrangement, position, orientation, size, and the like, of features and components shown in FIGS. 6A and 6B are provided as examples. In practice, RF interconnect 600 may include additional features and/or components, fewer features and/or components, different features and/or components, differently arranged features and/or components, differently positioned features and/or components, differently oriented features and/or components, or differently sized features and/or components than those shown in FIGS. 6A and 6B. For example, while tapered shims 665 of RF interconnect 600 are shown as being positioned symmetrically with respect to horizontal RF feed 605, in some implementations, tapered shims 665 need not be positioned symmetrically with respect to horizontal RF feed 605. Additionally, or alternatively, a set of features and/or a set of components (e.g., one or more features and/or one or more components) of RF interconnect 600 may perform one or more functions described as being performed by another set of features and/or components of RF interconnect 600.

Implementations described herein may provide various RF interconnects with reduced RF signal path lengths (e.g., as compared to a typical RF interconnect) and/or RF signal paths directly to an active region of a sliver (e.g., such that a need for RF routing on the sliver is reduced and/or eliminated), thereby allowing for reduced RF insertion loss and/or increased optical modulator bandwidth.

Additionally, the RF interconnects described herein may reduce and/or eliminate RF loss on a modulator substrate that may otherwise be introduced by RF routing on the modulator substrate. As described in the above implementations, this may be achieved by performing the RF routing on a separate, low RF loss RF interconnect located above, below, on or along the modulator substrate, for example, using an interposer with a substrate that causes low RF loss (e.g., as compared to RF loss that may otherwise be caused by the modulator substrate). In some implementations, if the optical modulator is in a flip-chip orientation (e.g., upside down), then the RF interconnect is directly below the modulator substrate.

The foregoing disclosure provides illustration and description, but is not intended to be exhaustive or to limit the implementations to the precise form disclosed. Modifications and variations are possible in light of the above disclosure or may be acquired from practice of the implementations.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A radio frequency (RF) interconnect for an optical modulator, the RF interconnect comprising:
   a circuit board to route a set of RF signals from a corresponding set of RF feeds to a substrate interface, via an interposer interface, on a surface of a substrate of the optical modulator,
   the interposer interface being aligned with the substrate interface in a vertical direction only,
   the circuit board being positioned along the surface of the substrate of the optical modulator, and
   the circuit board including a set of traces,
      a trace, of the set of traces, being connected to a corresponding RF feed, of the set of RF feeds, at a height different than a height of the surface of the substrate of the optical modulator,
      the trace being connected to the substrate interface; and
   an interposer positioned in a cavity of the circuit board such that the set of traces are to be routed from the circuit board to the substrate interface via the interposer.

2. The RF interconnect of claim 1, where the substrate interface is located at a start of, or within, an active region of the substrate of the optical modulator.

3. The RF interconnect of claim 1, where the circuit board is to route the set of RF signals in a horizontal direction and a vertical direction within the circuit board.

4. The RF interconnect of claim 1, where the set of RF feeds is positioned substantially parallel or substantially perpendicular to the surface of the substrate of the optical modulator.

5. The RF interconnect of claim 1, where the circuit board includes a circuit board patterned interface on a surface of the circuit board,
   the circuit board patterned interface connecting the set of traces to the substrate interface.

6. The RF interconnect of claim 5, where the circuit board is positioned such that the circuit board patterned interface is aligned with the substrate interface,
   a first amount of RF loss, associated with a substrate of the circuit board, being less than a second amount of RF loss associated with the substrate of the optical modulator, and
   a first trace width, associated with the circuit board patterned interface, being greater than a second trace width associated with the substrate interface.

7. The RF interconnect of claim 5, further comprising:
   a conductive component comprising a micro-bump array, a micro-pipe array or a set if micro-copper pillars,
   the circuit board patterned interface being connected to the substrate interface via the conductive component.

8. The RF interconnect of claim 1, where the circuit board includes a center step.

9. An interconnect, comprising:
   an interposer to route a signal from a signal feed to a substrate interface, via an interposer interface, of an optical modulator,
   the interposer interface being aligned with the substrate interface in a vertical direction only,
   the interposer being positioned along a surface of a substrate of the optical modulator, and
   the interposer including a trace,
      the trace being connected to the signal feed at a height different than a height of the surface of the substrate of the optical modulator, the trace being connected to the substrate interface, and the interposer including a cavity and another interposer,
      the other interposer being positioned in the cavity of the interposer such that the trace is to be routed through or on the other interposer.

10. The interconnect of claim 9, where the substrate interface is located at a start of, or within, an active region of the substrate of the optical modulator.

11. The interconnect of claim 9, where the trace is to route the signal in a horizontal direction or a vertical direction within the interposer.

12. The interconnect of claim 9, further comprising a conductive component comprising a micro-bump array, a micro-pipe array or a set if micro-copper pillars,
   the trace being connected to the substrate interface via the conductive component.

13. The interconnect of claim 9, where the interposer interface is located on a surface of the interposer,
   the interposer interface being connected to the trace,
   a configuration of the interposer interface matching a configuration of the substrate interface, and
   the interposer is aligned with the interposer interface.

14. The interconnect of claim 9, where the interposer includes a cavity,
   the cavity being oriented such that one or more sides of the cavity are substantially orthogonal to one or more sides of the interposer.

15. The interconnect of claim 9, where the interposer is a micro-air coaxial stack.

16. An electrical interconnect, comprising:
   an interposer positioned along a substrate surface of an optical substrate,
   the interposer including a trace associated with routing an electrical signal to an active region of the optical substrate via an interposer interface,
   the interposer interface being aligned with the active region in a vertical direction only,
   the interposer including a cavity that is oriented such that one or more sides of the cavity are substantially orthogonal to one or more sides of the interposer,
   the trace being commenced on the interposer in a plane that is at a different height than a plane corresponding to the substrate surface, and
   the trace connecting to a substrate interface of the optical substrate proximal to the active region.

17. The electrical interconnect of claim 16, where the interposer includes a patterned interface on a surface of the interposer,
   the patterned interface connecting the trace to the substrate interface, and the patterned interface having a configuration complementary to a configuration of the substrate interface.

18. The electrical interconnect of claim 16, where the interposer is to route the electrical signal to the substrate interface via a micro-bump array, a micro-pipe array, or a set of micro-copper pillars.

19. The RF interconnect of claim 1, where at least one of a shape or a configuration of the interposer interface matches a corresponding shape or configuration of the substrate interface.

20. The RF interconnect of claim 1, where the cavity that is oriented such that one or more sides of the cavity are substantially orthogonal to one or more sides of the interposer.

21. The electrical interconnect of claim 16, where at least one of a shape or a configuration of the interposer interface matches a corresponding shape or configuration of the active region.

* * * * *